(12) United States Patent
Grivna

(10) Patent No.: US 8,766,910 B2
(45) Date of Patent: Jul. 1, 2014

(54) CAPACITIVE SENSING CONTROL KNOB

(75) Inventor: Edward L. Grivna, Brooklyn Park, MN (US)

(73) Assignee: Cypress Semiconductor Corporation, San Jose, CA (US)

( * ) Notice: Subject to any disclaimer, the term of this patent is extended or adjusted under 35 U.S.C. 154(b) by 1386 days.

(21) Appl. No.: 12/006,491

(22) Filed: Jan. 2, 2008

(65) Prior Publication Data

US 2009/0009491 A1    Jan. 8, 2009

Related U.S. Application Data

(60) Provisional application No. 60/947,951, filed on Jul. 4, 2007.

(51) Int. Cl.
*G09G 5/00* (2006.01)

(52) U.S. Cl.
USPC .......................................... 345/156

(58) Field of Classification Search
USPC ................ 345/156–184; 178/18.01–20.04; 200/564–572, 11 R–11 TW, 36–38 E, 200/600; 74/552–553, 10.22, 473.3–473.35
See application file for complete search history.

(56) References Cited

U.S. PATENT DOCUMENTS

| | | | |
|---|---|---|---|
| 4,736,191 A | 4/1988 | Matzke et al. | |
| 5,305,017 A | 4/1994 | Gerpheide | |
| 5,691,747 A * | 11/1997 | Amano | 345/167 |
| 6,219,035 B1 * | 4/2001 | Skog | 345/161 |
| 6,239,389 B1 | 5/2001 | Allen et al. | |
| 6,380,931 B1 | 4/2002 | Gillespie et al. | |
| 6,473,069 B1 | 10/2002 | Gerpheide | |
| 7,253,643 B1 * | 8/2007 | Seguine | 324/686 |
| 7,288,946 B2 | 10/2007 | Hargreaves et al. | |
| 7,301,350 B2 | 11/2007 | Hargreaves et al. | |
| 7,810,050 B2 * | 10/2010 | Hirai et al. | 715/863 |
| 2002/0015024 A1 * | 2/2002 | Westerman et al. | 345/173 |
| 2004/0189595 A1 * | 9/2004 | Yuasa et al. | 345/156 |
| 2004/0252109 A1 | 12/2004 | Trent, Jr. et al. | |
| 2006/0055006 A1 * | 3/2006 | Orth et al. | 257/659 |
| 2006/0066582 A1 | 3/2006 | Lyon et al. | |
| 2006/0082545 A1 * | 4/2006 | Choquet et al. | 345/156 |
| 2006/0097991 A1 | 5/2006 | Hotelling et al. | |
| 2006/0197750 A1 * | 9/2006 | Kerr et al. | 345/173 |

(Continued)

FOREIGN PATENT DOCUMENTS

WO    WO 2006104132 A1 *    10/2006

OTHER PUBLICATIONS

Mark Lee, "CapSense Best Practices", Cypress Application Note AN2394, Rev.**, Oct. 19, 2006, pp. 1-10.

(Continued)

*Primary Examiner* — Alexander Eisen
*Assistant Examiner* — Patrick F Marinelli

(57) ABSTRACT

Apparatuses and methods for detecting interaction of a user with a sensor array disposed on the wall of a protrusion from the surface of a control panel of a device that physically resembles a mechanical knob protruding from the surface of the control panel of the device. The method may include receiving a plurality of signals from the sensor array and detecting interaction of a user with the sensor array based on the plurality of signals.

10 Claims, 13 Drawing Sheets

(56) References Cited

U.S. PATENT DOCUMENTS

| | | | |
|---|---|---|---|
| 2007/0229466 A1* | 10/2007 | Peng et al. | 345/173 |
| 2008/0001919 A1* | 1/2008 | Pascucci | 345/163 |
| 2008/0006453 A1* | 1/2008 | Hotelling | 178/18.06 |
| 2008/0158164 A1* | 7/2008 | Lee | 345/173 |
| 2008/0238879 A1* | 10/2008 | Jaeger et al. | 345/173 |
| 2008/0257706 A1* | 10/2008 | Haag | 200/600 |
| 2011/0240455 A1* | 10/2011 | Kulczycki et al. | 200/600 |

OTHER PUBLICATIONS

Mark Lee, "The Art of Capacitive Touch Sensing", Cypress Perform, Published in Embedded.com (http://www.embedded.com, Mar. 2007.

CSR User Module Data Sheet, CSR v1.0, CY8C21x34 Data Sheet, Oct. 6, 2006, pp. 1-36.

CSD User Module Data Sheet, CSD v1.0, Oct. 23, 2006, pp. 1-58.

Robert Jania, "Cypress CapSense Successive Approximation Algorithm", White Paper CSA RJO.doc, Jan. 17, 2007, pp. 1-6.

* cited by examiner

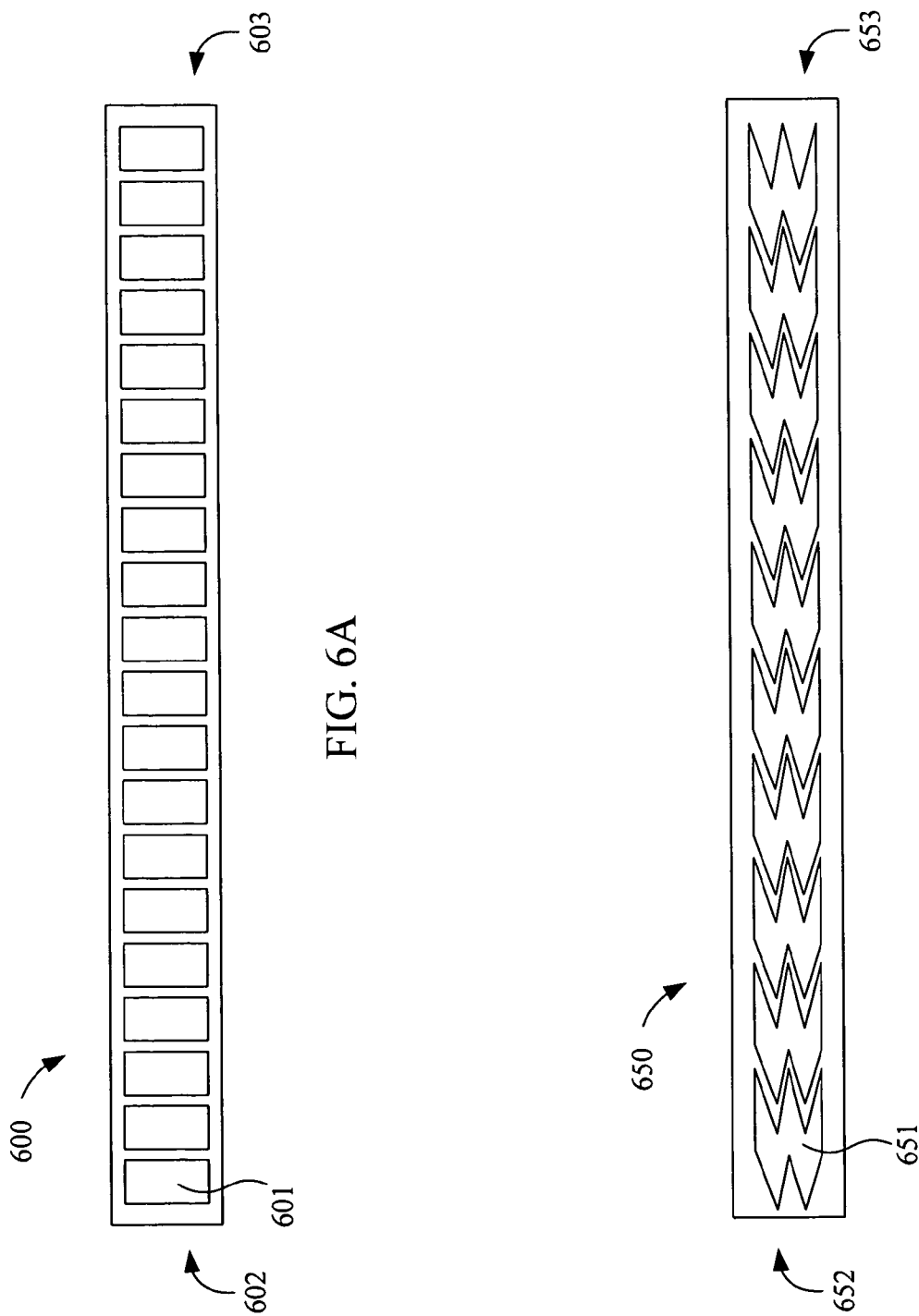

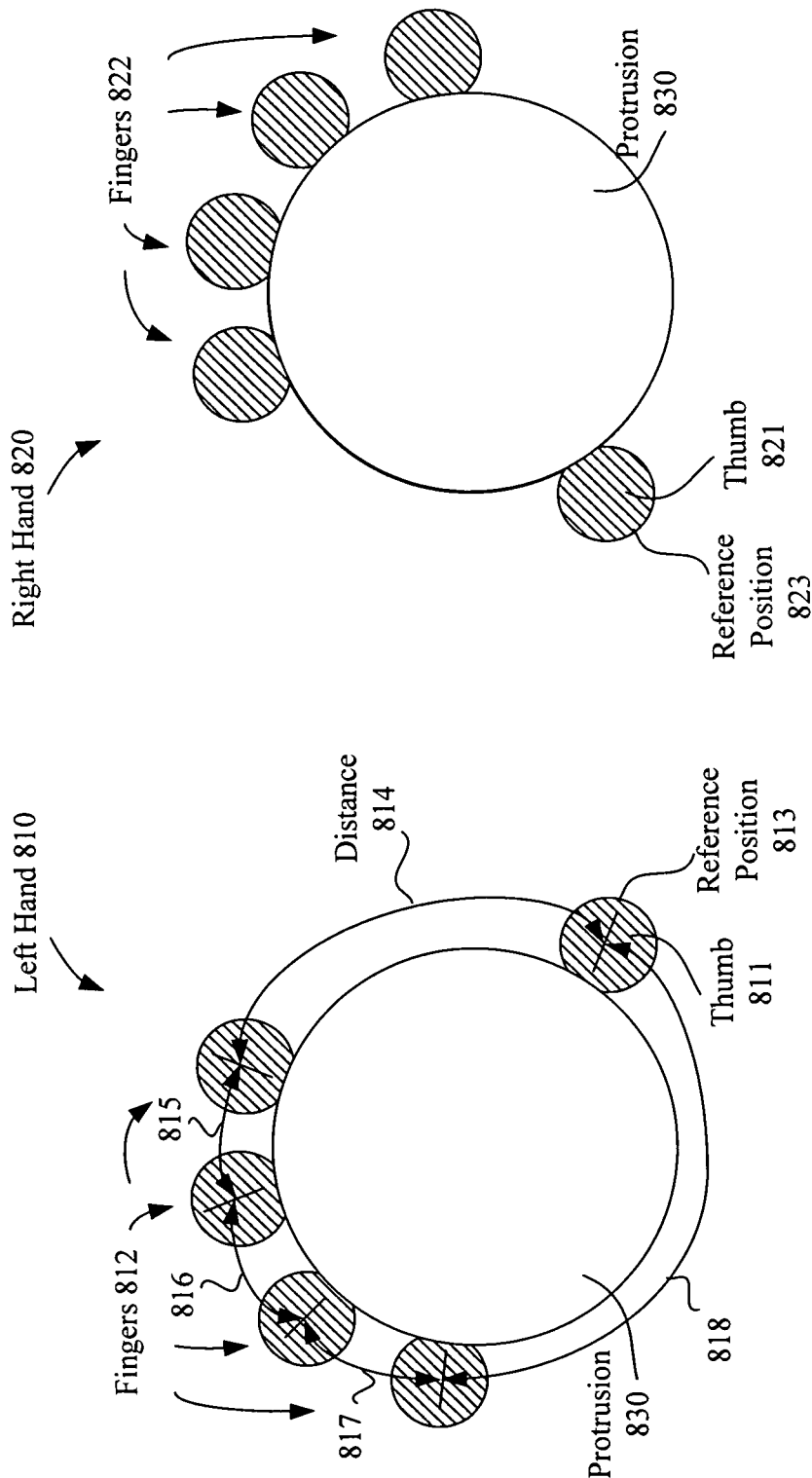

CAPACITIVE SENSING CONTROL KNOB

RELATED APPLICATIONS

This application claims the benefit of U.S. Provisional Application No. 60/947,951, filed Jul. 4, 2007, the entire contents of which are hereby incorporated by reference herein.

TECHNICAL FIELD

This invention relates to the field of user interface devices and, in particular, to touch-sensor devices.

BACKGROUND

Computing devices, such as notebook computers, personal digital assistants (PDAs), kiosks, and mobile handsets, have user interface devices, which are also known as human interface devices (HID). Capacitance sensing has been implemented in a wide variety of user interfaces of electronic devices to replace mechanical buttons and other controls in the electronic devices. Examples of capacitance sensing devices include touchpads on notebook computers, touchscreens, and slider controls used for menu navigation in cellular phones, personal music players, and other hand held electronic devices.

Capacitance sensing has many advantages over conventional cursor control devices, mechanical switches, and rotary encoders. A principal such advantage is the lack of moving parts, which allows capacitance sensing to provide great improvements in reliability, since there are no moving parts to wear out.

One type of conventional capacitance sensing device is a slider that operates by way of capacitance sensing utilizing capacitive sensors. The capacitance detected by a capacitive sensor changes as a function of the proximity of a conductive object to the sensor. The conductive object can be, for example, a stylus or a user's finger. In an electronic device, a change in capacitance detected by each sensor in the sensor array due to the proximity or movement of a conductive object can be measured by a variety of methods. The touch-sensor devices may include single sensor elements or elements arranged in multiple dimensions for detecting a presence of the conductive object on the touch-sensor device. Regardless of the method, usually an electrical signal representative of the capacitance detected by each capacitive sensor is processed by a processing device, which in turn produces electrical or optical signals representative of the position of the conductive object in relation to the capacitance sensing device, such as in relation to the touch-sensor pad in the X and Y dimensions.

FIG. 1A illustrates a conventional linear touch-sensor slider. The linear touch-sensor slider 110 includes a surface area 111 on which a conductive object may be sensed to control a setting on a device, such as volume or brightness. Alternatively, the linear touch-sensor slider 110 may be used for scrolling functions. The construction of touch-sensor slider 110 may be similar to that of a touch-sensor pad. Touch-sensor slider 110 may include a sensor array capable of detection in only one dimension (referred to herein as one-dimensional sensor array). The slider structure may include one or more sensor elements that may be conductive traces. By positioning or manipulating a conductive object in contact or in proximity to a particular portion of the slider structure, the capacitance between each conductive trace and ground varies and can be detected. The capacitance variation may be sensed as a signal on the conductive trace by a processing device. It should also be noted that the sensing may be performed in a differential fashion, obviating the need for a ground, virtual ground, or other reference. For example, by detecting the relative capacitance of each sensor element, the position and/or motion (if any) of the external conductive object can be determined. It can be determined which sensor element has detected the presence of the conductive object, and it can also be determined the motion and/or the position of the conductive object over multiple sensor elements.

Radial sensing is conventionally done using a radial slider that is used in detecting position information on planar sensor elements disposed in a circular manner, as illustrated in FIG. 1B. The radial sensor array 120 of FIG. 1B includes multiple sensor elements 121 disposed in a circular pattern. Radial sensing may also be done using a touchpad with radius and degree output from the touchpad. Radial sensing using a touchpad, however, uses more complex position algorithms, such as to perform conversion from X and Y locations to a radius and angle. Also, touchpads may have small sensor activation areas, resulting in a decrease in sensitivity.

One type of human interface device that has replaced the mechanical knob with a planar radial slider is small, handheld devices. While a planar radial slider may be appropriate for a small, handheld device, it may not be appropriate for larger appliances, like a wide variety of household appliances, sometimes referred to as white goods, for example, air conditioner, dishwasher, washing machine, clothes dryer, freezer, refrigerator, stove (also referred to as range, cooker, oven, oven range, cooking plate, or cooktop), water heater, toaster oven, blender, heater, mixer, or the like, whose normal user interface includes one or more mechanical knobs. Also, the planar radial slider may not be appropriate for industrial appliances whose normal interface is one or more large mechanical knobs. The traditional implementation of controls on these larger appliances is in the form of mechanical knobs coupled to electromechanical timers, switches, rheostats, and other controls. These knobs are designed to be operated by rotating these mechanical knobs with a complete hand, instead of just a finger as done in a planar radial slider of a handheld device.

Mechanical knobs may be, for example, cylindrical handles that one pulls or rotates to perform some function on the device, such as powering on or off the device, switching between modes of the device, or controlling a setting on a device, such as adjusting a volume, a brightness of a display, a temperature, a speed, or other control operations.

FIG. 1C illustrates a conventional clothes dryer 130 with a mechanical control knob 131 that controls at least a portion of the operations of the clothes dryer 130. An operator of the clothes dryer uses a complete hand to rotate the mechanical control knob 131, for example, to change the operational mode of the clothes dryer 130, adjust the temperature of the clothes dryer 130, or the like.

The conventional devices that implement mechanical control knobs are subject to wearing of the moving parts from regular use. In a conventional mechanical knob-controlled interface, the mechanical knob mounts to a shaft, with the shaft passing through a bushing to get through an opening of the front panel. The openings that allow mechanical motion of the mechanical knob subject the device to possible contamination, for example, from water, dirt, corrosives, or the like. In addition, these openings may allow paths for electrostatic discharge (ESD) events into the circuitry of the control panel. Another disadvantage of mechanical control knobs is that the top surface of the knob has a limited use due to the required motion of the mechanical control knob. Another disadvantage is that upon power loss, the mechanical control knob may leave the device in a dangerous condition when the power is restored.

BRIEF DESCRIPTION OF THE DRAWINGS

The present invention is illustrated by way of example, and not by way of limitation, in the figures of the accompanying drawings.

FIG. 6A illustrates one embodiment of a linear sensor array to be disposed on a wall of the cylindrical protrusion of FIG. 5B.

FIG. 6B illustrates another embodiment of a linear sensor array to be disposed on a wall of the cylindrical protrusion of FIG. 5B.

FIG. 8A illustrates detected fingers and thumb of a left hand on a sensor array disposed on a wall of a protrusion of a control panel according to one embodiment of the present invention.

FIG. 8B illustrates detected fingers and thumb of a right hand on a sensor array of the protrusion of FIG. 8A.

DETAILED DESCRIPTION

Figure 1A:
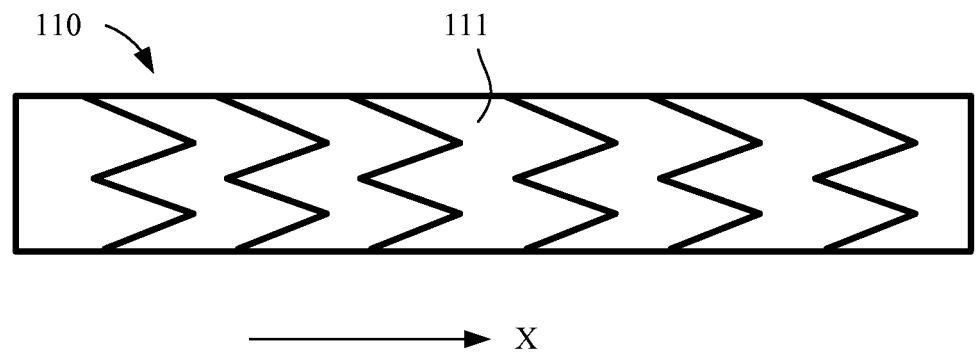
FIG. 1A illustrates a conventional linear touch-sensor slider.
Figure 1B:
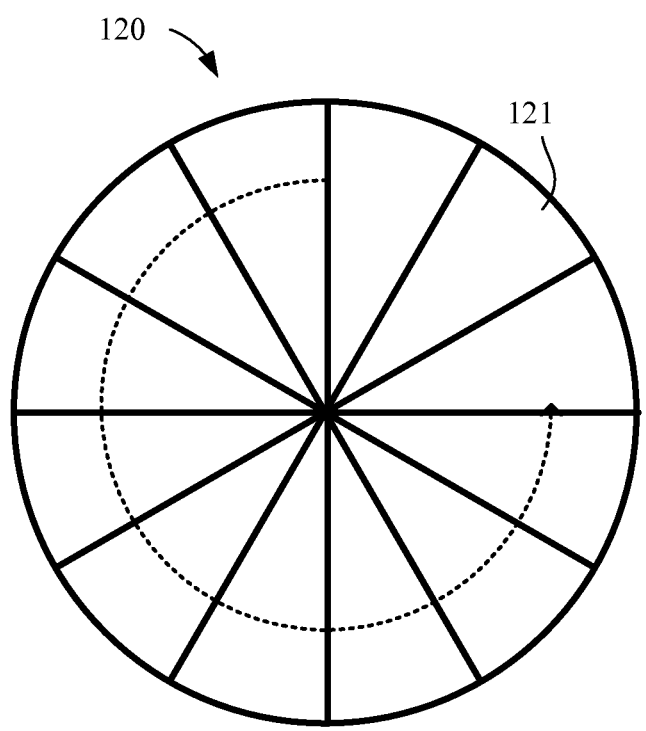
FIG. 1B illustrates a conventional radial slider.

Described herein are apparatuses and methods for detecting interaction of a user with a sensor array disposed on the wall of a protrusion from the surface of a control panel of a device that physically resembles a mechanical knob protruding from the surface of the control panel of the device. The following description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth are merely exemplary. Particular implementations may vary from these exemplary details and still be contemplated to be within the spirit and scope of the present invention.

Embodiments of a method and apparatus are described to detect interaction of a user with a sensor array disposed on the wall of a protrusion from the surface of a control panel of a device that physically resembles a mechanical knob protruding from the surface of the control panel of the device. As described above, many traditional human interfaces are being replaced by capacitance sensing equivalents. One that has seen some level of conversion is the knob as evidenced by planar, radial sliders on hand held devices that replacing a knob. However, these planar, radial sliders may not be appropriate for non-handheld devices, such as household or industrial appliances. The typical interface for these types of devices generally includes one or more large mechanical knobs. As described above, these knobs are designed to be operated by a complete hand, instead of just a finger, with the user rotating these knobs. Using the embodiments described herein, as a hand grasps the side of the protrusion, the thumb comes down in isolation from the remainder of the fingers. This allows the thumb to be detected and used for direction and motion tracking.

The embodiments described are directed at keeping the user interface the same, that of placing a hand around a cylindrical protrusion on the control surface of the appliance and controlling the appliance the same with a rotation motion. This can be implemented by lining the interior or exterior wall of the cylinder with a linear capacitance-sensing slider. Although a user interface device could implement a radial slider on a completely flat control panel, such a change in physical design may not be accepted by the users as it is a radical departure from the historical control interface that has a protruding knob to rotate. The embodiments described herein maintain a user interface that the customer is familiar with, while including the benefits of capacitance sensing (e.g., sealed environment, no moving parts).

In one embodiment, the mechanical knob of a control panel of device is replaced with a portion of cylindrical or conical shape that is extruded or otherwise exists above the planar surface of the control panel interface of the device or equipment. In the assembly of the embodiments described herein, the bottom perimeter of the cylinder or conical protrusion may be sealed against the control panel, or alternatively, may be formed as a single piece with the planar section of the control panel. The control panel may contain an opening in the underside of this protrusion to allow access to the interior of the cylinder section, for example, to dispose the sensor array on the inner wall of the protrusion. This seal serves to prevent contamination from spills or other dirt that may come in contact with the surface during regular use of the device or equipment. This seal also presents a barrier against electrostatic discharge (ESD) events that could otherwise damage control circuitry located behind the control panel.

In another embodiment, likewise the top surface of the cylindrical or conical protrusion is also sealed, thus creating a hollow or concave section behind the cylindrical or conical protrusion. This allows the hollow cylinder or conical section to physically resemble a mechanical knob protruding from the controls surface of the product. Depending on the specific application, this protrusion may be optically clear to allow viewing of displays or other indicators mounted behind the surface wall of the cylinder, or may be opaque for those cases when the indication of function or operation is provided either by visual indicators on the planar surface or other forms of indication (e.g., audible). Alternatively, the display or other indicators can be mounted on the planar surface of the control panel around the perimeter of the control knob. The display and/or indicators may change depending on the mode of operation of the device.

In one embodiment, a linear capacitance-sensing slider is disposed on the inner surface of the protrusion section of the control panel. This slider may be formed on a flexible printed circuit board on either an opaque, translucent, or optically transparent substrate, having multiple opaque, translucent, or optically transparent conductive sensor elements spaced across the surface of the linear slider. The specific material set (opaque, translucent, or optically transparent) is determined by the material used in the cylinder section and the optional use of lighting behind the linear slider. In one embodiment, the length of the linear slider is approximately equal to the inner circumference of the cylinder, such that when the slider is adhered to the inner wall of said cylinder it effectively forms a second cylinder of equal diameter. In another embodiment, the linear slider is approximately equal to the outer circumference of the cylinder, such that when the slider is adhered to the outer wall of said cylinder it effectively forms a second cylinder of equal diameter. Alternatively, other lengths of slider may be used.

In another embodiment, the slider is composed of a sufficient number and shape of capacitance sensor elements, also referred to as sensing pads, to allow reasonably accurate detection of the location of at least one isolated finger placed along the outside wall of the protruding cylinder or cone. This may be accomplished with a large number of approximately rectangular sensor elements, a smaller number of sensor elements having saw-tooth-shaped edges, a certain number of trapezoidal sensor elements when using a conical section, or the like. When the ends of these linear sliders are connected, the sensor elements form a cylinder or conical section that is used by a processing device to detect a presence of one or more conductive objects on the outer wall of the cylindrical or conical protrusion.

In one embodiment of a linear slider, each sensor element is optimally connected to a tab or other connection point approximately in the center of the slider while lying flat. This provides the shortest path between all the sensor elements and the processing device (e.g., capacitance-sensing controller) that measures their capacitance. Such connections may alternately be made at other locations along the slider flexible circuit board. It should also be noted that it may also be possible to print, plate, sputter, injection mould, or otherwise dispose the conductive sensing elements directly to the inside or outside wall of the cylinder or conical protrusion, and in doing so, remove a separate flexible circuit board from the end product assembly.

In one embodiment of the slider assembly, the slider is electrically connected to and monitored by a processing device, such as a capacitance sensing controller, such as, for example, the Programmable System on a Chip (PSoC®) processing device, developed by Cypress Semiconductor Corporation, San Jose, Calif. Alternatively, the processing device may be one or more other known processing devices. It should be noted that while traditional linear sliders; i.e., those designed for operation by a single finger, may make use of diplexing to reduce the number of connections to the capacitance sensing controller, such diplexing is normally precluded by the necessity to detect multiple touches on the slider. Diplexing is a way of using fewer connections to the controller to sense multiple sensor elements. This is done by re-ordering the connections to the controller from alternate parts of the sensor array. For example, consider a 12-sensor linear slider where there are only 6 connections to the controller. The first six sensors are connected in order of 1, 2, 3, 4, 5, 6. The remaining six sensors are connected as 1, 3, 5, 2, 4, 6. Since any touch will be sensed across the three nearest pads, a touch in the first six sensors would be detected across three sequentially numbered sensors. If this same touch was in the second set of six sensors, it would have holes in the mapping telling the system that it is in the second set and that the sensors must be interpreted in a different sequence.

The embodiments described herein provide a non-rotating, non-planar capacitance-sensing control element that physically resembles a mechanical knob protruding from the surface of the control panel of the device. The control element may have internal displays on either or both of the planar surface of the control element and the non-planar surfaces of the control element. Also, as described herein, the control element may return the device to a safe condition following loss of power to the device. Also described herein is an algorithm to isolate the thumb as a reference position from multiple simultaneous touches on a linear slider (e.g., cylindrical or conical linear slider). The embodiments described herein include a capacitive sensing interface that uses a combination of hardware and firmware elements to determine the position of one or more fingers on a sensor array and make decisions in a user interface based on the position and/or movement of the one or more fingers along the array.

The embodiments described herein may provide an advantage over conventional mechanically coupled control interfaces by providing a sealed front assembly to prevent possible contamination from, for example, water, dirt, corrosives, or the like and to prevent paths for ESD events into the circuitry of the control panel on the other side of the control panel. The embodiments described herein may also provide an advantage over conventional capacitance sensing systems by providing a user interface that is familiar to the users of these types of devices. The embodiments described herein reduce the amount of bulky mechanical components that are typically used for the mechanical knobs. The embodiments described herein may also provide an advantage over conventional capacitance sensing systems by providing a display on the surface of the control knob, since there may not be moving mechanical components on the control knob. Another advantage of the present embodiments is that the control knob can be configured to provide multiple functions for the same control knob; for example, the detected rotation of the conductive objects on the sensor array can be mapped to a first function, such as mode select, and then same control knob can be used to adjust the temperature, and/or set a timer. Alternatively, other types of functions can be implemented in different modes by the same control knob. The embodiments described herein may include transparent conductive material for the slider, such as Poly(3,4-ethylenedioxythiophene) (PEDOT) or Indium Tin Oxide (ITO), that allows an internal state or position indicators to be displayed on or through portions of the protrusion, such as the on the walls of the protrusion.

The embodiments described herein may also provide an advantage over conventional control systems by putting the device in a safe condition following loss of power to the device. The embodiments described herein may also provide an advantage over conventional mechanical control systems by providing a user interface that allows a user that is physically challenged to control the user interface without requiring physical strength to actually turn the control knob, since the control knob may have no moving parts and detects the position and movement of the user's hand around the sensor array disposed on a wall of the protrusion.

Figure 2:
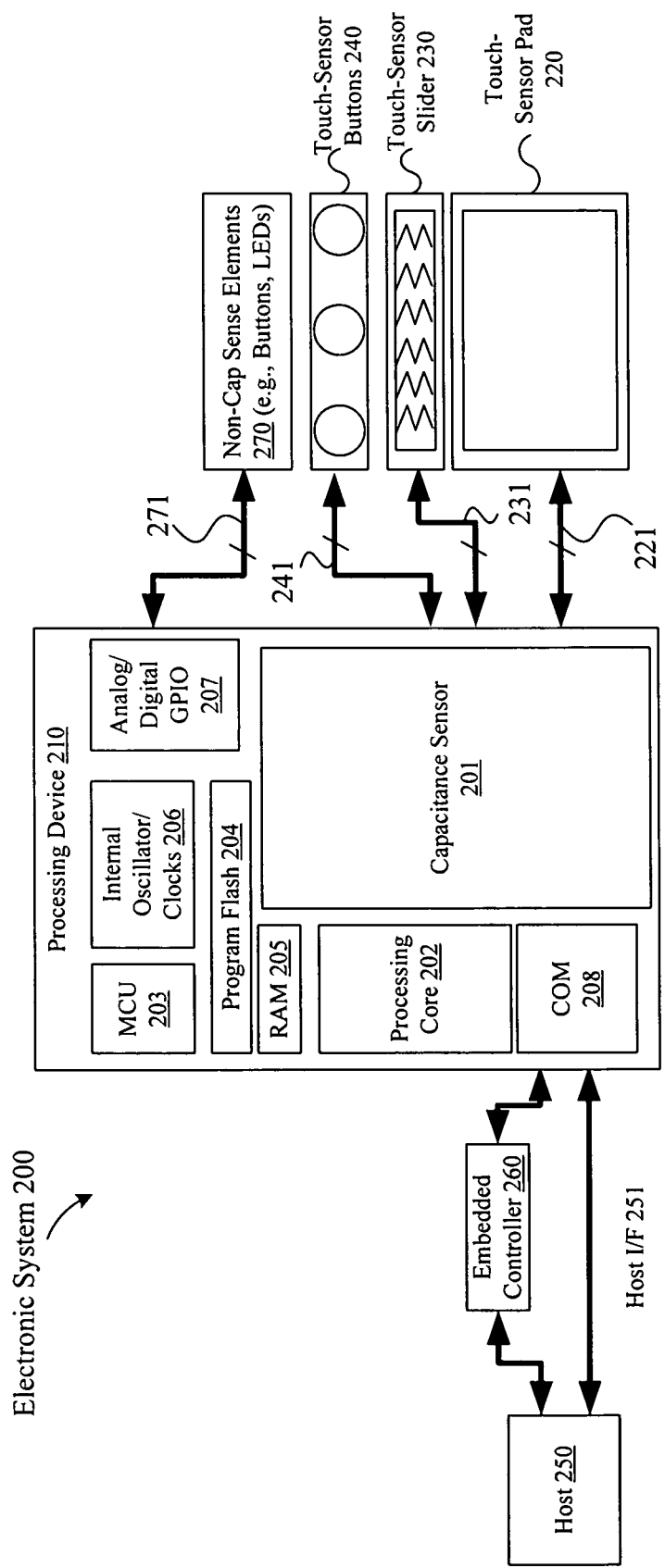
FIG. 2 illustrates a block diagram of one embodiment of an electronic system having a processing device for detecting a presence of a conductive object.

FIG. 2 illustrates a block diagram of one embodiment of an electronic system having a processing device for detecting a presence of a conductive object. Electronic system 200 includes processing device 210, touch-sensor pad 220, touch-sensor slider 230, touch-sensor buttons 240, host processor 250, embedded controller 260, and non-capacitance sensor elements 270. The processing device 210 may include analog and/or digital general purpose input/output ("GPIO") ports 207. GPIO ports 207 may be programmable. GPIO ports 207 may be coupled to a Programmable Interconnect, and Logic ("PIL"), which acts as an interconnect between GPIO ports 207 and a digital block array of the processing device 210 (not illustrated). The digital block array may be configured to implement a variety of digital logic circuits (e.g., DAC, digital filters, digital control systems) using, in one embodiment, software or firmware in the form of configurable user modules ("UMs"). The digital block array may be coupled to a system bus (not illustrated). Processing device 210 may also include memory, such as random access memory (RAM) 205 and program flash 204. RAM 205 may be static RAM (SRAM) or the like, and program flash 204 may be a non-volatile storage, or the like, which may be used to store firmware (e.g., control algorithms executable by processing core 202 to implement operations described herein). Processing device 210 may also include a memory controller unit (MCU) 203 coupled to memory and the processing core 202.

The processing device 210 may also include an analog block array (not illustrated). The analog block array is also coupled to the system bus. Analog block array also may be configured to implement a variety of analog circuits (e.g., ADC, analog filters) using, in one embodiment, configurable UMs. The analog block array may also be coupled to the GPIO 207.

As illustrated, capacitance sensor 201 may be integrated into processing device 210. Capacitance sensor 201 may include analog I/O for coupling to an external component, such as touch-sensor pad 220, touch-sensor slider 230, touch-sensor buttons 240, and/or other devices. Capacitance sensor 201 and processing device 210 are described in more detail below.

It should also be noted that the embodiments described herein may be implemented in sensing technologies other than capacitive sensing, such as resistive, optical imaging, surface acoustical wave (SAW), infrared, dispersive signal, strain gauge technologies, or the like. Similarly, the operations described herein are not limited to notebook pointer operations, but can include other operations, such as lighting control (dimmer), temperature or environmental control, volume control, graphic equalizer control, speed control, or other control operations requiring gradual or discrete adjustments. It should also be noted that these embodiments of capacitive sensing implementations may be used in conjunction with non-capacitive sensing elements, including but not limited to pick buttons, sliders (ex. display brightness and contrast), scroll-wheels, multi-media control (ex. volume, track advance, etc.) handwriting recognition and numeric keypad operation.

In one embodiment, the electronic system 200 includes a touch-sensor pad 220 coupled to the processing device 210 via bus 221. Touch-sensor pad 220 may include a two-dimension sensor array. The two-dimension sensor array includes multiple sensor elements, organized as rows and columns. In another embodiment, the electronic system 200 includes a touch-sensor slider 230 coupled to the processing device 210 via bus 231. Touch-sensor slider 230 may include a single-dimension sensor array. The single-dimension sensor array includes multiple sensor elements, organized as rows, or, as columns, or alternatively, as radial elements. In another embodiment, the electronic system 200 includes touch-sensor buttons 240 coupled to the processing device 210 via bus 241. Touch-sensor buttons 240 may include a single-dimension or multi-dimension sensor array. The single- or multi-dimension sensor array may include multiple sensor elements. For touch-sensor buttons, the sensor elements may be coupled together to detect a presence of a conductive object over the entire surface of the sensing device. Alternatively, the touch-sensor button 240 has a single sensor element to detect the presence of the conductive object. In one embodiment, the touch-sensor button 240 may be a capacitance sensor element. Capacitance sensor elements may be used as non-contact sensors. These sensor elements, when protected by an insulating layer, offer resistance to severe environments.

The electronic system 200 may include any combination of one or more of the touch-sensor pad 220, touch-sensor slider 230, and touch-sensor button 240. In another embodiment, the electronic system 200 may also include non-capacitance sensor elements 270 coupled to the processing device 210 via bus 271. The non-capacitance sensor elements 270 may include buttons, light emitting diodes (LEDs), and other user interface devices, such as a mouse, a keyboard, a display, or other functional keys that do not require capacitance sensing. In one embodiment, buses 271, 241, 231, and 221 may be a single bus. Alternatively, these buses may be configured into any combination of one or more separate buses.

The processing device 210 may also provide value-added functionality such as keyboard control integration, LEDs, battery charger, and general purpose I/O, as illustrated as non-capacitance sensor elements 270. Non-capacitance sensor elements 270 are coupled to the GPIO 207.

Processing device 210 may include internal oscillator/clocks 206 and communication block 208. The oscillator/clocks block 206 provides clock signals to one or more of the components of processing device 210. Communication block 208 may be used to communicate with an external component, such as a host processor 250, via host interface (I/F) 251. Alternatively, the processing device 210 may also be coupled to embedded controller 260 to communicate with the external components, such as host 250. Interfacing to the host 250 can be through various methods. In one exemplary embodiment, interfacing with the host 250 may be done using a standard PS/2 interface to connect to an embedded controller 260, which in turn sends data to the host 250 via a low pin count (LPC) interface. In some instances, it may be beneficial for the processing device 210 to do both sensing device and keyboard control operations, thereby freeing up the embedded controller 260 for other housekeeping functions. In another exemplary embodiment, interfacing may be done using a universal serial bus (USB) interface directly coupled to the host 250 via host interface 251. Alternatively, the processing device 210 may communicate to external components, such as the host 250 using industry standard interfaces, such as USB, PS/2, inter-integrated circuit (I2C) bus, Serial Peripheral Interface (SPI), or the like. The host 250 and/or embedded controller 260 may be coupled to the processing device 210 with a rigid ribbon, or flex cable from an assembly, which houses the sensing device and processing device.

In one embodiment, the processing device 210 is configured to communicate with the embedded controller 260 or the host 250 to send and/or receive data. The data may be a command or alternatively a signal. Alternatively, the processing device 210 may be configured to communicate with the embedded controller 260 or the host 250, using non-OS drivers, such as dedicated touch-sensor pad drivers, or other drivers known by those of ordinary skill in the art.

In one embodiment, the processing device 210 may operate to communicate data (e.g., commands or signals) using hardware, software, and/or firmware, and the data may be communicated directly to the processing device of the host 250, such as a host processor, or alternatively, may be communicated to the host 250 via drivers of the host 250, such as OS drivers, or other non-OS drivers. It should also be noted that the host 250 may communicate directly with the processing device 210 via host interface 251.

Processing device 210 may reside on a common carrier substrate such as, for example, an integrated circuit (IC) die substrate, a multi-chip module substrate, or the like. Alternatively, the components of processing device 210 may be one or more separate integrated circuits and/or discrete components. In one exemplary embodiment, processing device 210 may be the Programmable System on a Chip (PSoC®) processing device, developed by Cypress Semiconductor Corporation, San Jose, Calif. Alternatively, processing device 210 may be one or more other processing devices known by those of ordinary skill in the art, such as a microprocessor or central processing unit, a controller, special-purpose processor, digital signal processor (DSP), an application specific integrated circuit (ASIC), a field programmable gate array (FPGA), or the like. In an alternative embodiment, for example, the processing device may be a network processor having multiple processors including a core unit and multiple microengines. Additionally, the processing device may include any combination of general-purpose processing device(s) and special-purpose processing device(s).

It should also be noted that the embodiments described herein are not limited to having a configuration of a processing device coupled to a host, but may include a system that measures the capacitance on the sensing device and sends the raw data to a host computer where it is analyzed by an application. In effect the processing that is done by processing device 210 may also be done in the host. In another embodiment, the processing device 210 is the host.

In one embodiment, the method and apparatus described herein may be implemented in a fully self-contained sensing device, which outputs fully processed X/Y movement and gesture data signals or data commands to a host. In another embodiment, the method and apparatus may be implemented in a sensing device, which outputs X/Y movement data and also finger presence data to a host, and where the host processes the received data to detect gestures. In another embodiment, the method and apparatus may be implemented in a sensing device, which outputs raw capacitance data to a host, where the host processes the capacitance data to compensate for quiescent and stray capacitance, and calculates X/Y movement and detects gestures by processing the capacitance data. Alternatively, the method and apparatus may be implemented in a sensing device, which outputs pre-processed capacitance data to a host, where the sensing device processes the capacitance data to compensate for quiescent and stray capacitance, and the host calculates X/Y movement and detects gestures from the pre-processed capacitance data. Alternatively, other configurations are possible.

Capacitance sensor 201 may be integrated into the processing device 210, or alternatively, in a separate IC. Alternatively, descriptions of capacitance sensor 201 may be generated and compiled for incorporation into other integrated circuits. For example, behavioral level code describing capacitance sensor 201, or portions thereof, may be generated using a hardware description language, such as VHDL or Verilog, and stored to a computer-accessible medium (e.g., Flash ROM, CD-ROM, hard disk, floppy disk, etc.). Furthermore, the behavioral level code can be compiled into a netlist, or even a circuit layout and stored to a computer-accessible medium. The behavioral level code, the netlist, and the circuit layout all represent various levels of abstraction to describe capacitance sensor 201.

It should be noted that the components of electronic system 200 may include all the components described above. Alternatively, electronic system 200 may include only some of the components described above, or include additional components not listed herein.

In one embodiment, electronic system 200 is implemented in a control panel of a household appliance, such as, for example, air conditioner, dishwasher, washing machine, clothes dryer, freezer, refrigerator, stove (also referred to as range, cooker, oven, oven range, cooking plate, or cooktop), water heater, toaster oven, blender, heater, mixer, or the like. Alternatively, the electronic system 200 may be used in other applications, such as industrial applications, or other appliances whose normal user interface includes one or more mechanical knobs.

In one embodiment, capacitance sensor 201 is based on a capacitance sensing relaxation oscillator (CSR), as described below with respect to FIG. 3C. The CSR may be coupled to an array of sensor elements using a current-programmable relaxation oscillator, an analog multiplexer, digital counting functions, and high-level software routines to compensate for environmental and physical sensor element variations. The sensor array may include combinations of independent sensor elements. The CSR may include physical, electrical, and software components. The physical components may include the physical sensor element itself, typically a pattern of conductive elements constructed on a PCB with an insulating cover, a flexible membrane, or a transparent overlay. The electrical component may include an oscillator or other means to convert a capacitance into a measured value. The electrical component may also include a counter or timer to measure the oscillator output. The software component may include detection and compensation algorithms to convert the count value (e.g., capacitance value) into a sensor element detection decision (also referred to as switch detection decision) or relative magnitude.

It should be noted that there are various known methods for measuring capacitance. Although some embodiments described herein are described using a relaxation oscillator, the present embodiments are not limited to using relaxation oscillators, but may include other methods, such as current versus voltage phase shift measurement, resistor-capacitor charge timing, capacitive bridge divider, charge transfer, successive approximation, sigma-delta modulators (illustrated below with respect to FIG. 3D), charge-accumulation circuits, field effect, mutual capacitance, frequency shift, or the like. It should be noted however, instead of evaluating the raw counts relative to a threshold, the capacitance sensor may be evaluating other measurements to determine the user interaction. For example, in the capacitance sensor having a sigma-delta modulator, the capacitance sensor is evaluating the ratio of pulse widths of the output, instead of the raw counts being over a certain threshold.

The current versus voltage phase shift measurement may include driving the capacitance through a fixed-value resistor to yield voltage and current waveforms that are out of phase by a predictable amount. The drive frequency can be adjusted to keep the phase measurement in a readily measured range. The resistor-capacitor charge timing may include charging the capacitor through a fixed resistor and measuring timing on the voltage ramp. Small capacitance values may require very large resistors for reasonable timing. The capacitive bridge divider may include driving the capacitor under test through a fixed reference capacitor. The reference capacitor and the capacitor under test form a voltage divider. The voltage signal may be recovered with a synchronous demodulator, which may be done in the processing device 210. The charge transfer may be conceptually similar to an R-C charging circuit. In this method, $C_f$ is the capacitance being sensed. $C_{SUM}$ is the summing capacitor, into which charge is transferred on successive cycles. At the start of the measurement cycle, the voltage on $C_{SUM}$ is discharged. The voltage on $C_{SUM}$ increases exponentially (and only slightly) with each clock cycle. The time for this voltage to reach a specific threshold is measured with a counter. Additional details regarding these alternative embodiments have not been included so as to not obscure the present embodiments, and because these alternative embodiments for measuring capacitance are known by those of ordinary skill in the art.

Figure 3A:
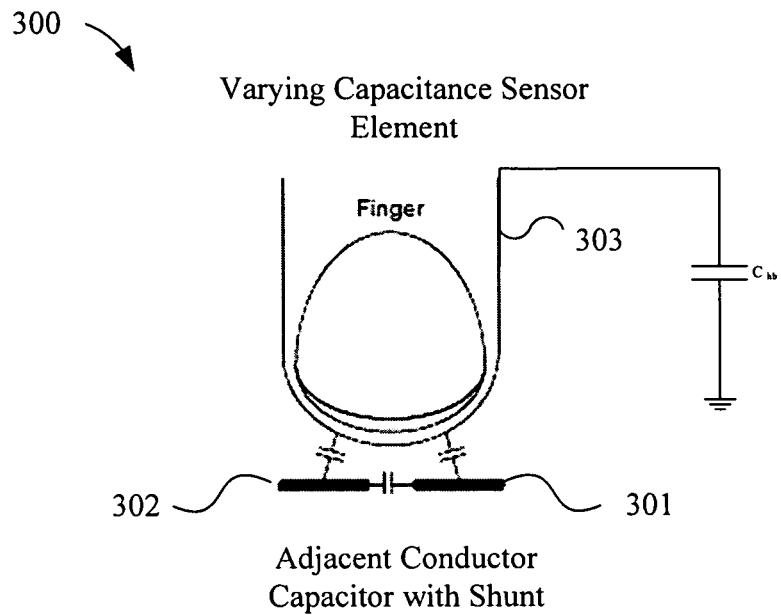
FIG. 3A illustrates a varying capacitance sensor element.

FIG. 3A illustrates a varying capacitance sensor element. In its basic form, a capacitance sensor element 300 is a pair of adjacent conductors 301 and 302. There is a small edge-to-edge capacitance, but the intent of sensor element layout is to minimize the parasitic capacitance $C_P$ between these conductors. When a conductive object 303 (e.g., finger) is placed in proximity to the two conductors 301 and 302, there is a capacitance between electrode 301 and the conductive object 303 and a similar capacitance between the conductive object 303 and the other electrode 302. The capacitance between the electrodes when no conductive object 303 is present is the base capacitance $C_P$ that may be stored as a baseline value. The capacitance value $C_F$ represents the capacitance from conductor 301 to conductive object 303 then to conductor 302. There is also a total capacitance ($C_P+C_F$) on the sensor element 300 when the conductive object 303 is present on or in close proximity to the sensor element 300. The baseline capacitance value $C_P$ may be subtracted from the total capacitance when the conductive object 303 is present to determine the change in capacitance (e.g., capacitance variation $C_F$) when the conductive object 303 is present and when the conductive object 303 is not present on the sensor element. Effectively, the capacitance variation $C_F$ can be measured to determine whether a conductive object 303 is present or not (e.g., sensor activation) on the sensor element 300. In the case of the finger as a conductive object 303, the conductive object 303 is usually grounded via the human body's capacitance to ground. In this case, the conductive surface of the sensor element is physically and electrically isolated from the grounded human body connection. The $C_P$ connection can be modeled two different ways and may make a significant difference in sensitivity.

Capacitance sensor element 300 may be used in a capacitance sensor array. The capacitance sensor array is a set of capacitors where one side of each capacitor is connected to a system ground. When the capacitance sensor element 300 is used in the sensor array, when the conductor 301 is sensed, the conductor 302 is connected to ground, and when the conductor 302 is sensed, the conductor 301 is connected to ground. Alternatively, when the sensor element is used for a touch-sensor button, the sensor element is sensed and the sensed button area may be surrounded by a fixed ground. The presence of the conductive object 303 increases the capacitance ($C_P+C_F$) of the sensor element 300 to ground. Determining sensor element activation is then a matter of measuring change in the capacitance ($C_F$) or capacitance variation. Sensor element 300 is also known as a grounded variable capacitor.

The conductive object 303 in this embodiment has been illustrated as a finger. Alternatively, this technique may be applied to any conductive object, for example, a conductive door switch, position sensor, or conductive pen in a stylus tracking system (e.g., stylus).

Figure 3B:
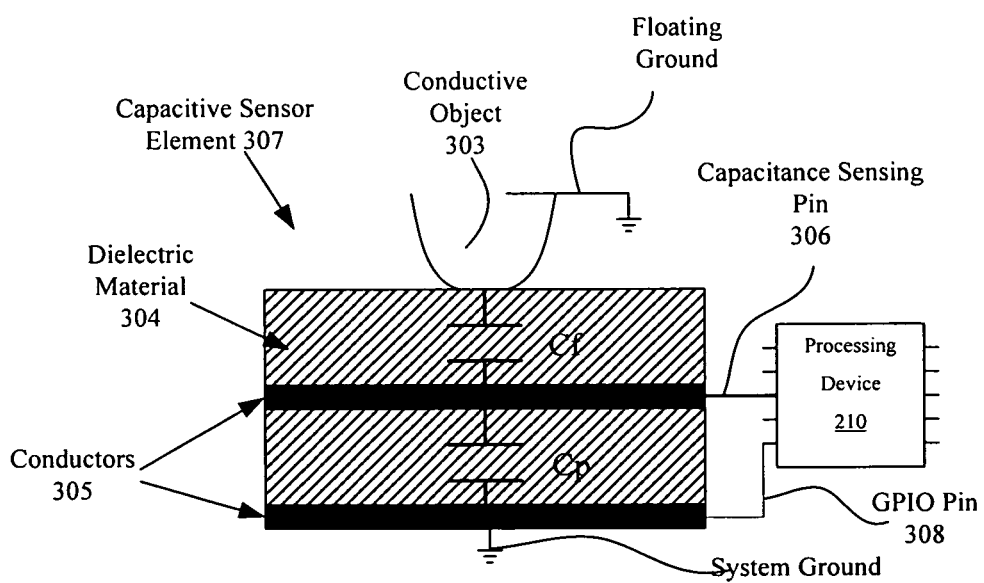
FIG. 3B illustrates one embodiment of a sensing device coupled to a processing device.

FIG. 3B illustrates one embodiment of a capacitance sensor element 307 coupled to a processing device 210. Capacitance sensor element 307 illustrates the capacitance as seen by the processing device 210 on the capacitance sensing pin 306. As described above, when a conductive object 303 (e.g., finger) is placed in proximity to one of the conductors 305, there is a capacitance, $C_F$, between the one of the conductors 305 and the conductive object 303 with respect to ground. This ground, however, may be a floating ground. Also, there is a capacitance, $C_P$, between the conductors 305, with one of the conductors 305 being connected to a system ground. The grounded conductor may be coupled to the processing device 210 using GPIO pin 308. The conductors 305 may be metal, or alternatively, the conductors may be conductive ink (e.g., carbon ink, silver ink), conductive ceramic (e.g., transparent conductors of ITO), conductive polymers, or the like. In one embodiment, the grounded conductor may be an adjacent sensor element that is grounded while the capacitance on the neighboring sensor element is measured. Alternatively, the grounded conductor may be other grounding mechanisms, such as a surrounding ground plane. Accordingly, the processing device 210 can measure the change in capacitance, capacitance variation $C_F$, as the conductive object 303 is in proximity to one of the conductors 305. Above and below the conductor that is closest to the conductive object 303 is dielectric material 304. The dielectric material 304 above the conductor 305 can be an overlay. The overlay may be non-conductive material used to protect the circuitry from environmental conditions and electrostatic discharge (ESD), and to insulate the user's finger (e.g., conductive object 303) from the circuitry. Capacitance sensor element 307 may be a sensor element of a touch-sensor pad, a touch-sensor slider, a touch-sensor button, or the like.

Figure 3C:
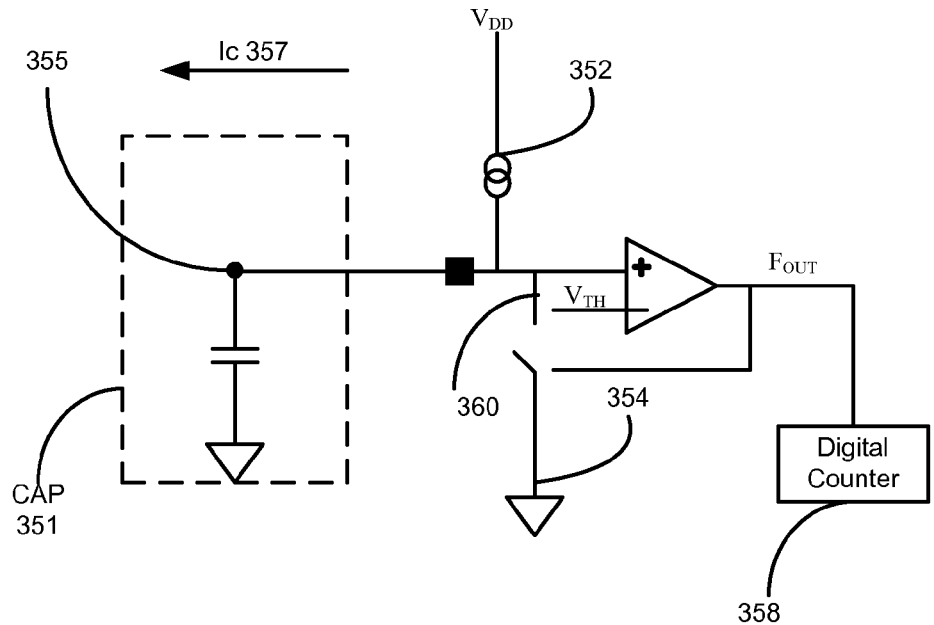
FIG. 3C illustrates one embodiment of a relaxation oscillator for measuring capacitance on a sensor element.

FIG. 3C illustrates one embodiment of a relaxation oscillator. The relaxation oscillator 350 is formed by the capacitance to be measured on capacitor 351, a charging current source 352, a comparator 353, and a reset switch 354 (also referred to as a discharge switch). It should be noted that capacitor 351 is representative of the capacitance measured on a sensor element of a sensor array. The relaxation oscillator is coupled to drive a charging current (Ic) 357 in a single direction onto a device under test ("DUT") capacitor, capacitor 351. As the charging current accumulates charge on the capacitor 351, the voltage across the capacitor increases with time as a function of Ic 357 and its capacitance C. Equation (1) describes the relation between current, capacitance, voltage, and time for a charging capacitor.

$$CdV = I_C dt \tag{1}$$

The relaxation oscillator begins by charging the capacitor 351, at a fixed current Ic 357, from a ground potential or zero voltage until the voltage across the capacitor 351 at node 355 reaches a reference voltage or threshold voltage, $V_{TH}$ 360. At the threshold voltage $V_{TH}$ 360, the relaxation oscillator allows the accumulated charge at node 355 to discharge (e.g., the capacitor 351 to "relax" back to the ground potential) and then the process repeats itself. In particular, the output of comparator 353 asserts a clock signal $F_{OUT}$ 356 (e.g., $F_{OUT}$ 356 goes high), which enables the reset switch 354. This discharges the capacitor at node 355 to ground and the charge cycle starts again. The relaxation oscillator outputs a relaxation oscillator clock signal ($F_{OUT}$ 356) having a frequency ($f_{RO}$) dependent upon capacitance C of the capacitor 351 and charging current Ic 357 of the form of equation (2).

$$f_{RO} = \frac{i}{C * V_{TH}} \tag{2}$$

The comparator trip time of the comparator 353 and reset switch 354 add a fixed delay. The output of the comparator 353 is synchronized with a reference system clock to guarantee that the reset time is long enough to completely discharge capacitor 351. This sets a practical upper limit to the operating frequency. For example, if capacitance C of the capacitor 351 changes, then $f_{RO}$ changes proportionally according to Equation (2). By comparing $f_{RO}$ of $F_{OUT}$ 356 against the frequency ($f_{REF}$) of a known reference system clock signal (REF CLK), the change in capacitance ΔC can be measured. This is typically done by counting the number (N) of REF CLKs in an integer number of $f_{RO}$ periods and storing the result as a digital count ($n_{RO}$), as in equations (3) and (4).

$$n_{RO} = \frac{N * f_{REF}}{f_{RO}} \tag{3}$$

$$n_{RO} = \frac{N * C * V_{TH} * f_{REF}}{i} \tag{4}$$

In one embodiment, a frequency counter may be coupled to receive relaxation oscillator clock signal ($F_{OUT}$ 356) and continuously monitor the frequency, and output a signal indicative of the difference Δf between the current frequency and a stored value indicative of a baseline capacitance.

In one exemplary embodiment, the relaxation oscillator 350 may be built using a programmable timer (e.g., 555 timer) to implement the comparator 353 and reset switch 354. Alternatively, the relaxation oscillator 350 may be built using other circuitry. Relaxation oscillators are known by those of ordinary skill in the art, and accordingly, additional details regarding their operation have not been included so as to not obscure the present embodiments.

The capacitor charging current for the relaxation oscillator 350 may be generated in a register programmable current output DAC (also known as IDAC). Accordingly, the current source 352 may be a current DAC or IDAC. The IDAC output current may be set by an 8-bit value provided by the processing device 210, such as from the processing core 202. The 8-bit value may be stored in a register, in memory, or the like.

In many capacitance sensor element designs, the two "conductors" (e.g., 301 and 302) of the sensing capacitor are actually adjacent sensor elements that are electrically isolated (e.g., PCB pads or traces), as indicated in FIG. 3A. Typically, one of these conductors is connected to a system ground. Layouts for touch-sensor slider (e.g., linear slide sensor elements) and sensing device applications have sensor elements that may be immediately adjacent. In these cases, all of the sensor elements that are not active may be connected to a system ground through the GPIO 207 of the processing device 210 dedicated to that pin. The actual capacitance between adjacent conductors may be small ($C_P$), but the capacitance of the active conductor (and its PCB trace back to the processing device 210) to ground, when detecting the presence of the conductive object 303, may be considerably higher ($C_P + C_F$). The capacitance of two parallel conductors is given by the following equation:

$$C = \varepsilon_0 \cdot \varepsilon_R \cdot \frac{A}{d} = \varepsilon_R \cdot 8.85 \cdot \frac{A}{d} \text{ pF} \tag{5}$$

The dimensions of equation (5) are in meters. This is a very simple model of the capacitance. The reality is that there are fringing effects that substantially increase the sensor element-to-ground (and PCB trace-to-ground) capacitance.

There is some variation of sensor element sensitivity as a result of environmental factors. A baseline update routine, which compensates for this variation, may be provided in the high-level APIs.

As described above with respect to the relaxation oscillator 350, when a finger or conductive object 303 is placed on or in proximity to the sensor element, the capacitance increases from C.sub.P to C.sub.P+C.sub.F so the relaxation oscillator output signal 356 (F.sub.OUT) decreases in frequency. In one embodiment, the relaxation oscillator output signals 356 (F.sub.OUT) may be fed to a digital counter 358 for measurement. There are two methods for counting the relaxation oscillator output signal 356: frequency measurement and period measurement. Additional details of the relaxation oscillator and digital counter are known by those of ordinary skill in the art, and accordingly a detailed description regarding them has not been included. It should also be noted, that the embodiments described herein are not limited to using relaxation oscillators, but may include other sensing circuitry for measuring capacitance, such as current versus voltage phase shift measurement, resistor-capacitor charge timing, capacitive bridge divider, charge transfer, sigma-delta modulators, charge-accumulation circuits, field effect, mutual capacitance, or the like.

Figure 3D:
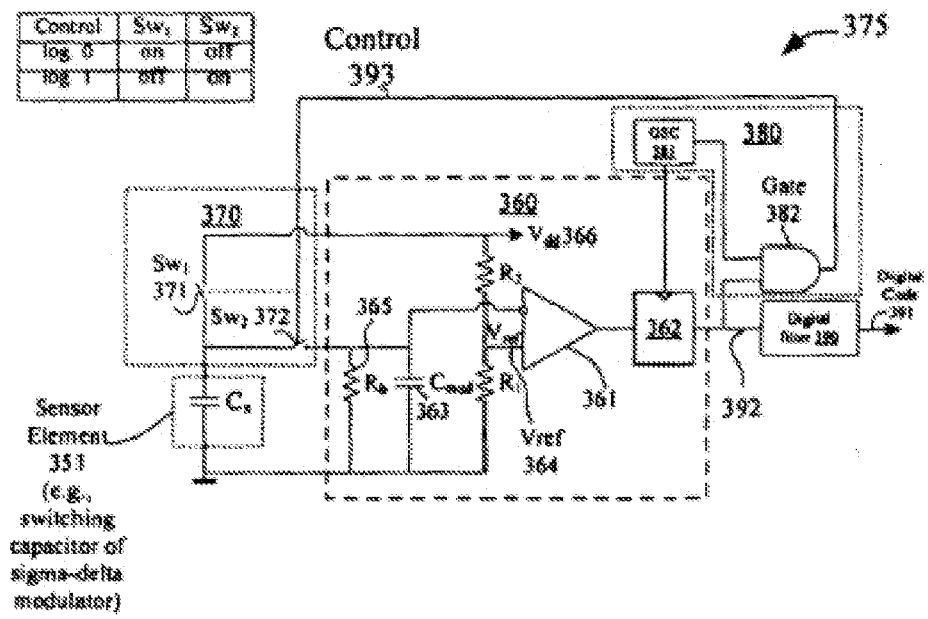
FIG. 3D illustrates a schematic of one embodiment of a circuit including a sigma-delta modulator and a digital filter for measuring capacitance on a sensor element.

FIG. 3D illustrates a schematic of one embodiment of a circuit 375 including a sigma-delta modulator 360 and a digital filter 390 for measuring capacitance on a sensor element 351. Circuit 375 includes a switching circuit 370, switching clock source 380, sigma-delta modulator 360, and digital filter 390 for measuring the capacitance on sensor element 351. Sensor element 351 may be a sensor element of a sensor array, and is represented as a switching capacitor $C_X$ in the modulator feedback loop. Alternatively, sensor element 351 may be a single sensor element, such as used in a touch-sensor button. Switching circuit 370 includes two switches $Sw_1$ 371 and $Sw_2$ 372. The switches $Sw_1$ 371 and $Sw_2$ 372 operate in two, non-overlapping phases (also known as break-before-make configuration). These switches together with sensing capacitor $C_x$ 351 form the switching capacitor equivalent resistor, which provides the modulator capacitor $C_{mod}$ 363 of sigma-delta modulator 360 charge current (as illustrated in FIG. 3D) or discharge current (not illustrated) during one of the two phases.

The sigma-delta modulator 360 includes the comparator 361, latch 362, modulator capacitor $C_{mod}$ 363, modulator feedback resistor 365, which may also be referred to as bias resistor 365, and voltage source 366. The output of the comparator may be configured to toggle when the voltage on the modulator capacitor 363 crosses a reference voltage 364. The reference voltage 364 may be a pre-programmed value, and may be configured to be programmable. The sigma-delta modulator 360 also includes a latch 362 coupled to the output of the comparator 361 to latch the output of the comparator 361 for a given amount of time, and provide as an output, output 392. The latch may be configured to latch the output of the comparator based on a clock signal from the gate circuit 382 (e.g., oscillator signal from the oscillator 381). In another embodiment, the sigma-delta modulator 360 includes a synchronized latch that operates to latch an output of the comparator for a pre-determined length of time. The output of the comparator may be latched for measuring or sampling the output signal of the comparator 361 by the digital filter 390.

Sigma-delta modulator 360 is configured to keep the voltage on the modulator capacitor 363 close to reference voltage $V_{ref}$ 364 by alternatively connecting the switching capacitor resistor (e.g., switches $Sw_1$ 371 and $Sw_2$ 372 and sensing capacitor $C_x$ 351) to the modulator capacitor 363. The output 392 of the sigma-delta modulator 360 (e.g., output of latch 362) is feedback to the switching clock circuit 380, which controls the timing of the switching operations of switches $Sw_1$ 371 and $Sw_2$ 372 of switching circuit 370. For example, in this embodiment, the switching clock circuit 380 includes an oscillator 381 and gate 382. Alternatively, the switching clock circuit 380 may include a clock source, such as a spread spectrum clock source (e.g., pseudo-random signal (PRS)), a frequency divider, a pulse width modulator (PWM), or the like. The output 392 of the sigma-delta modulator 360 is used with an oscillator signal to gate a control signal 393, which switches the switches $Sw_1$ 371 and $Sw_2$ 372 in a non-overlapping manner (e.g., two, non-overlapping phases). The output 392 of the sigma-delta modulator 360 is also output to digital filter 390, which filters and/or converts the output into the digital code 391.

In one embodiment of the method of operation, at power on, the modulator capacitor 363 has zero voltage and switching capacitor resistor (formed by sensing capacitor Cx 351, and switches $Sw_1$ 371 and $Sw_2$ 372) is connected between Vdd line 366 and modulator capacitor 363. This connection allows the voltage on the modulator capacitor 363 to rise. When this voltage reaches the comparator reference voltage, $V_{ref}$ 364, the comparator 361 toggles and gates the control signal 393 of the switches $Sw_1$ 371 and $Sw_2$ 372, stopping the charge current. Because the current via bias resistor $R_b$ 365 continues to flow, the voltage on modulator capacitor 363 starts to decrease. When the voltage decreases below the reference voltage 364, the output of the comparator 361 switches again, enabling the modulator capacitor 363 to start charging. The latch 362 and the comparator 361 set the sample frequency of the sigma-delta modulator 360.

The digital filter 390 is coupled to receive the output 392 of the sigma-delta modulator 360. The output 392 of the sigma-delta modulator 360 may be a single bit bit-stream, which can be filtered and/or converted to numerical values using a digital filter 390. In one embodiment, the digital filter 390 is a counter. In another embodiment, a standard Sync digital filter can be used. In another embodiment, the digital filter is a decimator. Alternatively, other digital filters may be used for filtering and/or converting the output 392 of the sigma-delta modulator 360 to provide the digital code 391. It should also be noted that the output 392 may be output to the decision logic 402 or other components of the processing device 210, or to the decision logic 451 or other components of the host 250 to process the bit-stream output of the sigma-delta modulator 360.

Described below are the mathematical equations that represent the operations of FIG. 3D. During a normal operation mode, the sigma-delta modulator 360 keeps these currents substantially equal on average by keeping the voltage on the modulator 363 equal to, or close to, the reference voltage $V_{ref}$ 364. The current of the bias resistor $R_b$ 365 is:

$$I_{Rb} = \frac{V_{cmod}}{R_b} \quad (6)$$

The sensing capacitor $C_x$ 351 in the switched-capacitor mode has equivalent resistance:

$$R_c = \frac{1}{f_s C_x} \quad (7)$$

where $f_s$ is the operation frequency of the switches (e.g., switching circuit 370). If the output 392 of the sigma-delta modulator 360 has a duty cycle of $d_{mod}$, the average current of the switching capacitor 351 can be expressed in the following equation (8):

$$I_c = d_{mod} \frac{V_{dd} - V_{Cmod}}{R_c} \quad (8)$$

In the operation mode, $$I_{Rb} = I_c, V_{Cmod} = V_{ref} \text{ or: } \frac{V_{ref}}{R_b} = d_{mod} \frac{V_{dd} - V_{Cmod}}{R_c} \quad (9)$$

or taking into account that the reference voltage 364 is part of supply voltage:

$$V_{ref} = k_d V_{dd}; k_d = \frac{R_1}{R_1 + R_2} \quad (10)$$

The Equation (9) can be rewritten in the following form:

$$d_{mod} = \frac{R_c}{R_b} \frac{k_d}{1 - k_d} = \frac{1}{f_s R_b} \frac{k_d}{1 - k_d} \frac{1}{C_x} \quad (11)$$

The Equation (11) determines the minimum sensing capacitance value, which can be measured with the proposed method at given parameters set:

$$d_{mod} \leq 1, \text{ or: } C_{xmin} = \frac{1}{f_s R_b} \frac{k_d}{1 - k_d} \quad (12)$$

The resolution of this method may be determined by the sigma-delta modulator duty cycle measurement resolution, which is represented in the following equations:

$$\Delta d_{mod} = \beta \frac{\Delta C_x}{C_x^2}; \quad (13)$$

$$\beta = \frac{1}{f_s R_b} \frac{k_d}{1-k_d}$$

or after rewriting relatively $\Delta C_x$, we obtain:

$$\Delta C_x = \frac{1}{\beta} \Delta d_{mod} C_x^2 \quad (14)$$

In one exemplary embodiment, the resistance of the bias resistor 365 is 20 k ohms ($R_b$=20 k), the operation frequency of the switches is 12 MHz ($f_s$=12 MHz), the capacitance on the switching capacitor 351 is 15 picofarads ($C_x$=15 pF), and the ratio between Vdd 366 and the voltage reference 364 is 0.25 ($k_d$=0.25), the duty cycle has a 12-bit resolution and the capacitance resolution is 0.036 pF.

In some embodiments of capacitive sensing applications, it may be important to get fast data measurements. For example, the modulator can operate at sample frequency 10 MHz (period is 0.1 microseconds (μs)), for the 12-bit resolution sample, and digital filter as single-type integrator/counter the measurement time is approximately 410 μs (e.g., $2^{12}$*0.1 μs=410 μs). For faster measurement speeds at the same resolution, other types of digital filters may be used, for example, by using the Sinc2 filter, the scanning time at the same resolution may be reduced approximately 4 times. Using this configuration, the sensing method should have suitable measurement speed. A good measurement rate may be accomplished by using a double integrator as the digital filter 390.

Figure 4:
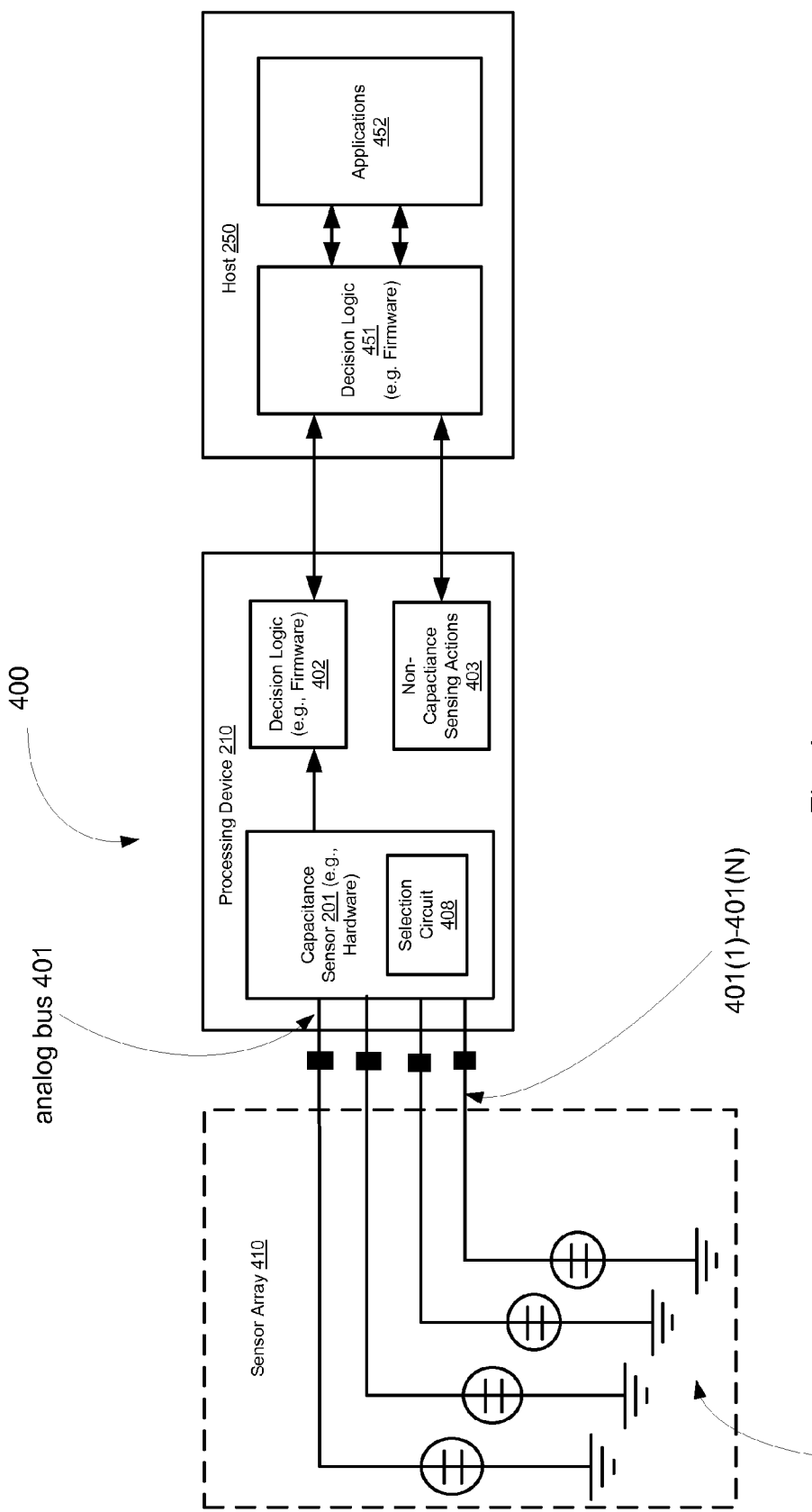
FIG. 4 illustrates a block diagram of one embodiment of an electronic device including a processing device that includes a capacitance sensor for measuring the capacitance on a sensor array.

FIG. 4 illustrates a block diagram of one embodiment of an electronic device 400 including a processing device 210 that includes a capacitance sensor 201 for measuring the capacitance on a sensor array 410. The electronic device 400 includes the sensor array 410, processing device 210, and host 250. The sensor array 410 may be a linear sensor array, as described herein, or the like. The sensor array 410 is coupled to pins 401(1)-401(N) of the processing device 210 via an analog bus 401 having multiple signals. Each sensor element is represented as a capacitor, as described above with respect to FIG. 3B. Sensor array 410 includes sensor elements 455(1)-455(N), where N is a positive integer value that represents the number of sensor elements of the sensor array 410.

In one embodiment, the capacitance sensor 201 includes a selection circuit 408. The selection circuit 408 is coupled to the sensor elements 455(1)-455(N) and the sensing circuitry of the capacitance sensor 201. Selection circuit 408 may be used to allow the capacitance sensor to measure capacitance on multiple sensor elements. The selection circuit 408 may be configured to sequentially select a sensor element of the multiple sensor elements to provide the charge current and to measure the capacitance of each sensor element. In one exemplary embodiment, the selection circuit 408 is a multiplexer array. Alternatively, the selection circuit 408 may be other circuitry inside or outside the capacitance sensor 201 to select the sensor element to be measured. In another embodiment, one capacitance sensor 201 is used to measure capacitance on all or less than all of the sensor elements of the sensor array 410. Alternatively, multiple capacitance sensors 201 may be used to measure capacitance on the sensor elements of the sensor array. The multiplexer array may also be used to connect the sensor elements that are not being measured to the system ground. This may be done in conjunction with a dedicated pin in the GP10 port 207. In another embodiment, the capacitance sensor 201 may be configured to simultaneously sense the sensor elements, as opposed to being configured to sequentially scan the sensor elements as described above.

In one embodiment, the processing device 210 further includes a decision logic block 402. The operations of decision logic block 402 may be implemented in firmware; alternatively, it may be implemented in hardware or software. The decision logic block 402 may be configured to receive the digital code or counts from the capacitance sensor 201, and to determine the state of the sensor array 410, such as whether a conductive object 303 is detected on or in proximity to the sensor array 410, whether a conductive object 303 is detected on the sensor array, where the conductive object 303 was detected on the sensor array (e.g., determining the X-, Y-coordinates of the presence of the conductive object 303), determining absolute or relative position of the conductive object 303, determining speed of the conductive object 303, or the like.

In another embodiment, instead of performing the operations of the decision logic 402 in the processing device 210, the processing device 201 may send the raw data to the host 250, as described above. Host 250, as illustrated in FIG. 4, may include decision logic 451. The operations of decision logic 451 may also be implemented in firmware, hardware, and/or software. Also, as described above, the host may include high-level APIs in applications 452 that perform routines on the received data, such as compensating for sensitivity differences, other compensation algorithms, baseline update routines, start-up and/or initialization routines, interpolation operations, scaling operations, or the like. The operations described with respect to the decision logic 402 may be implemented in decision logic 451, applications 452, or in other hardware, software, and/or firmware external to the processing device 210.

In another embodiment, the processing device 210 may also include a non-capacitance sensing actions block 403. This block may be used to process and/or receive/transmit data to and from the host 250. For example, additional components may be implemented to operate with the processing device 210 along with the sensor array 410 (e.g., keyboard, keypad, mouse, trackball, LEDs, displays, or the like).

At startup (or boot) the sensor elements (e.g., capacitors 455(1)-(N)) are scanned and the digital code or count values for each sensor element with no activation are stored as a baseline array ($C_P$). The presence of a finger on the sensor element or in proximity to the sensor element is determined by the difference in counts between a stored value for no sensor element activation and the acquired value with sensor element activation, referred to here as Δn. The sensitivity of a single sensor element is approximately:

$$\frac{\Delta n}{n} = \frac{C_F}{C_P} \quad (14)$$

The value of Δn should be large enough for reasonable resolution and clear indication of sensor element activation (e.g., button activation). This drives sensor element construction decisions. $C_F$ should be as large a fraction of $C_P$ as possible. Since $C_F$ is determined by finger area and distance from the finger to the sensor element's conductive traces (through the over-lying insulator), the baseline capacitance $C_P$ should be minimized. The baseline capacitance $C_P$ includes the capacitance of the sensor element pad plus any parasitics, including routing and chip pin capacitance.

Figure 1C:
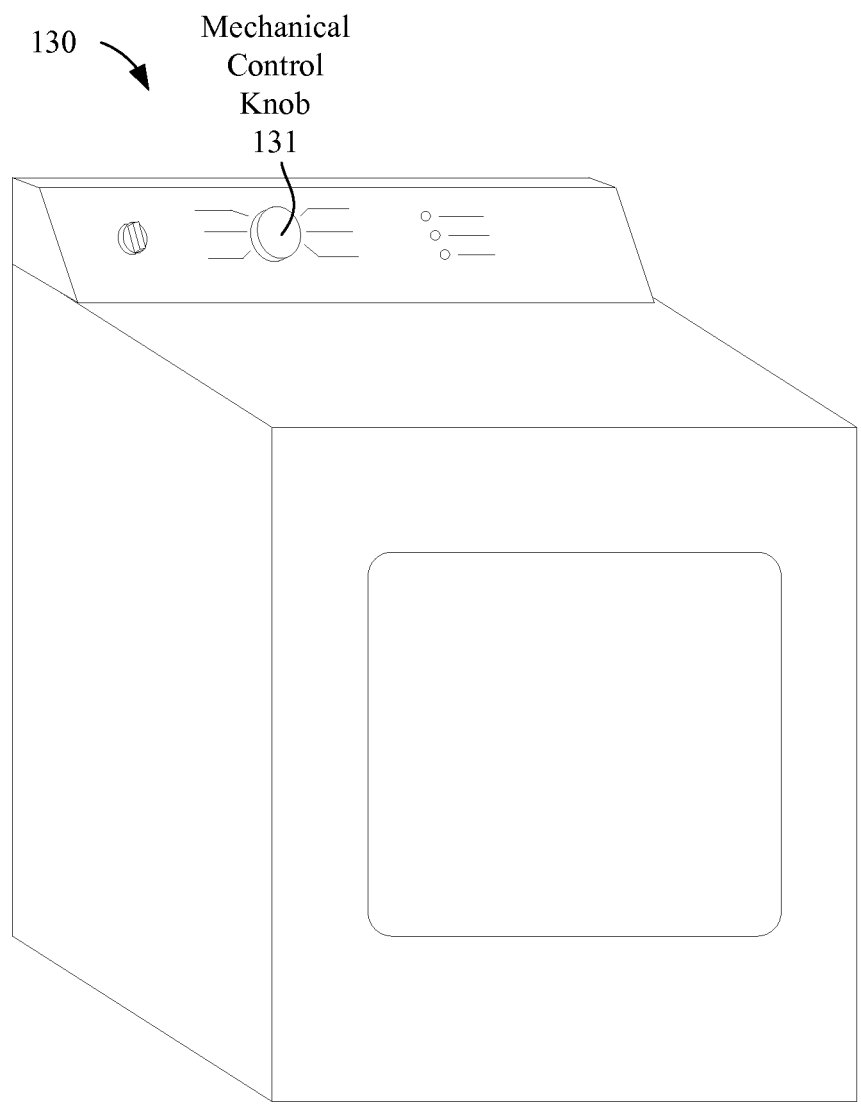
FIG. 1C illustrates a conventional clothes dryer with a mechanical control knob.
Figure 5A:
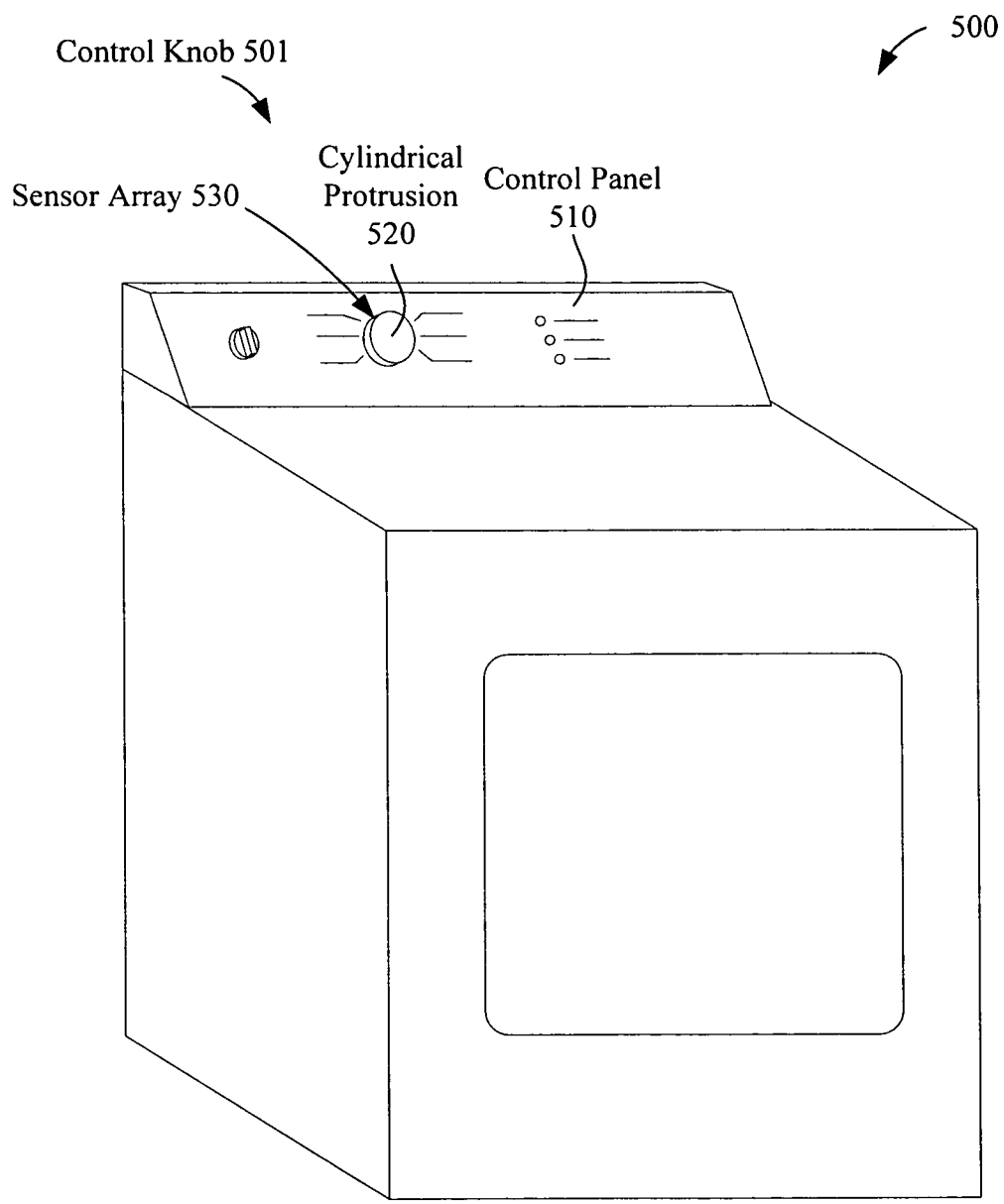
FIG. 5A illustrates one embodiment of a control panel having a sensor array disposed on a wall of a protrusion from the surface of the control panel that physically resembles a mechanical knob.

FIG. 5A illustrates one embodiment of a control panel 510 having a sensor array 530 disposed on a wall of a protrusion 420 from the surface of the control panel 510 that physically resembles a mechanical knob. The control panel 510 is a user interface of a clothes dryer 500. Although the embodiments herein are described with respect to the clothes dryer 500, in other embodiments, one or more protrusions 520 may be used as user interfaces of other types of devices, for example, air conditioner, dishwasher, washing machine, clothes dryer, freezer, refrigerator, stove (also referred to as range, cooker, oven, oven range, cooking plate, or cooktop), water heater, toaster oven, blender, heater, mixer, or the like. The clothes dryer 500 includes a control knob 501 that includes a cylindrical protrusion 520 from the surface of the control panel 510 that physically resembles the control knob 131 of the clothes dryer 130 of FIG. 1C. However, unlike the control knob 131 of the clothes dryer 130, the control knob 501 of the clothes dryer 500 is not a mechanical control knob, but includes a sensor array 530 that is disposed on a wall of the cylindrical protrusion 520. The control knob 501 may not include any moving parts, unlike the mechanical control knob 131. An operator of the appliance, instead of using a complete hand to rotate the mechanical control knob 131, may lightly grip the cylindrical protrusion and rotate their hand to emulate the rotation of the control knob 501, as if the user were rotating the mechanical control knob 131. The position of one of the fingers (e.g., the thumb) is tracked and used to determine the selected function or setting of the control knob 501. However, since the cylindrical protrusion 520 does not actually rotate, external indicators, such as visual or audible indicators, can be used to indicate user interaction with the control panel 510, such as the motion, position, or speed of the control knob 501. The control panel 510 may include other types of user interface devices than the control knob 501, such as mechanical buttons, capacitance-sensing buttons, displays, or the like.

Figure 5B:
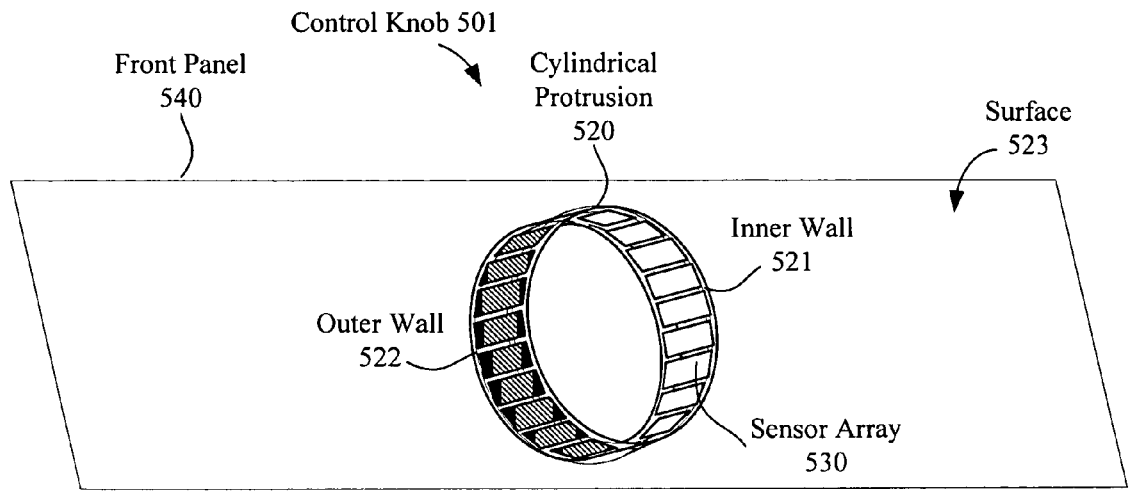
FIG. 5B illustrates one embodiment of a sensor array disposed on a wall of a cylindrical protrusion of the control panel of FIG. 5A.

FIG. 5B illustrates one embodiment of the sensor array 530 disposed on an inner wall 521 of the cylindrical protrusion 520 of FIG. 5A. The cylindrical protrusion 520 protrudes from the surface 523 of the front panel 540 of the control panel 510. The cylindrical protrusion 520 resembles a mechanical control knob; however, the cylindrical protrusion 520 may not include any moving parts. The control knob 501 includes a sensor array 530 that is disposed on the inner wall 521 of the cylindrical protrusion 520. In one embodiment, the sensor array 530 is a linear sensor array whose ends are connected together, forming a cylindrical sensor array that fits within the cylindrical protrusion 520. In another embodiment, the sensor array 530 may be disposed on the outer wall 522 of the cylindrical protrusion 520. Alternatively, the sensor array 530 may be a sensor array having multiple sensor elements disposed in other patterns on the inner or outer wall of a protrusion; for example, for a conical-shaped protrusion the sensor array may be a radial sensor array.

In one embodiment, the protrusion 520 and the front panel 540 are two separate pieces, and the bottom perimeter of the outer wall 522 is sealed against the front panel 540. The sealed protrusion 520 prevents contamination of the circuitry located on the other side of the control panel 510. The sealed protrusion 520 also prevents the circuitry from ESD events, since there are no openings in the front panel 540. In another embodiment, the cylindrical protrusion 520 and the front panel 540 are one integrated piece. The integrated piece includes an opening on the backside of the cylindrical protrusion 520 that allows access to the inner wall 521 of the cylindrical protrusion 520.

Figure 5C:
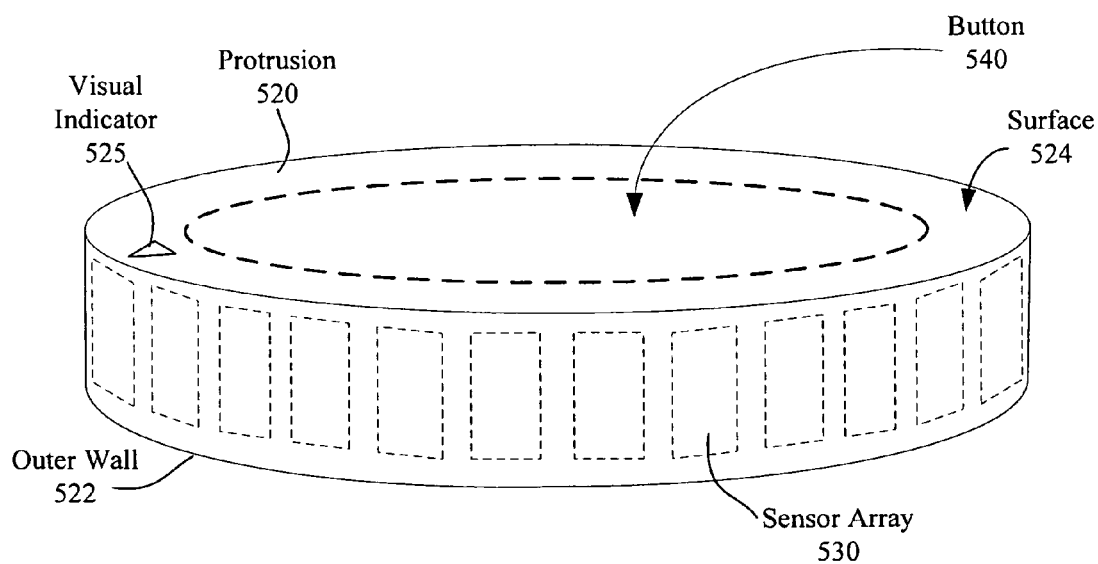
FIG. 5C illustrates one embodiment of the cylindrical protrusion of FIG. 5B having a button disposed on a top surface of the cylindrical protrusion.

The sensor array 530 is coupled to the processing device 210 (not illustrated in FIGS. 5A-5C). The processing device 210 receives multiple signals from the sensor array 530 and detects interaction of a user with the control panel 510 based on these signals. The processing device 210, as part of detecting the interaction, may determine a presence of one or more conductive objects that are in close proximity to, or touching the outer wall 522 of the cylindrical protrusion 520, a presence of the conductive object, a direction of movement of the conductive object, a position of the conductive object, a change in position of the conductive object with respect to the sensor array 530, or the like.

In one embodiment, the processing device 210 detects a single conductive object on the sensor array 530, such as a single finger. The processing device 210 can determining a presence of a conductive object on the sensor array 530, a direction of the conductive object on the sensor array 530, a position of the conductive object on the sensor array 530, and a change in position of the conductive object on the sensor array 530. The processing device 210 may also detect other metrics of the conductive object on the sensor a 530.

In another embodiment, the processing device 210 detects multiple conductive objects on the sensor array 530, such as three fingers including the thumb. The processing device 210 determines the positions of the multiple conductive objects and identifies one of them as a reference indicator based on the determined positions. The processing device 210 then determines a direction of movement of the reference indicator on the sensor array 530, a position on the sensor array 530, and the change in position of the reference indicator on the sensor array 530. In one embodiment, the processing device 210 determines a capacitance maximum or centroid of location for each of the conductive objects. The capacitance maxima correspond to the positions of the multiple conductive objects. In order to identify the reference indicator, the processing device 210 determines the distance between each adjacent position of the multiple conductive objects based on the sensed capacitance maxima, and identifies a reference position using the greatest distance between the adjacent positions of the multiple conductive objects. The conductive object that is located at reference position, or a calculated location within the largest gap, is then identified as the reference indicator. Due to the tight and uncontrolled spacing of most fingers on a hand when gripping a knob, the position and movement of these fingers may not be reliably detected and used for tracking position and direction of the fingers on the sensor array 530. However, as described below, the thumb is isolated from the other fingers when gripping an object. This is true for all primates with opposable thumbs. By determining the positions of the multiple conductive objects and determining the two largest gaps between these positions, the processing device 210 is able to isolate the location of the thumb from the locations of the other fingers or touches. Once the thumb is isolated a normal centroid calculation can be used to determine the center point that thumb on the sensor array 530. Due to the separation between the thumb and last finger (e.g., pinkie) on each hand, there will always be one gap that is substantially larger than all others. The calculated center of this gap may also be used as the reference location.

In one embodiment, the sensor array 530 is disposed as conductive traces on printed circuit board (PCB) (e.g., flexible PCB) that is disposed so that the sensor array 530 is positioned against the inner wall 521 of the cylindrical protrusion 520. The sensor array 530 may be formed on a flexible PCB on either an opaque, translucent, or optically transparent substrate having multiple opaque, translucent, or optically transparent capacitance sensor elements spaced across the surface of the sensor array 530. In another embodiment, the sensor array 530 is disposed on the surface of the inner wall 521 of the cylindrical protrusion 520 by a printing technique. In another embodiment, said sensor array 530 is disposed on the surface of the outer wall 522 of the cylindrical protrusion 520. The specific material set (opaque, translucent, or optically transparent) may be determined by the material used in the cylinder protrusion section of the control panel 510 and the optional use of lighting behind the sensor array 530. Alternatively, the sensor a 530 is disposed to the surface of either the inner wall 521 or outer wall 522 using various techniques, such as, for example, plating, sputtering, electroplating, injection molding, photolithography, depositing (e.g., chemical or physical vapor deposition), or the like. Electroplating, for example, is the process of using electrical current to coat an electrically conductive object with a relatively thin layer of metal. These techniques are known to those of ordinary skill in the art, and accordingly, a detailed description regarding these techniques has not been included, so as to not obscure the discussion of the present embodiments.

In one embodiment, the length of the sensor array 530 is approximately equal to the inner circumference of the cylinder, such that when the sensor array 530 is adhered to, or otherwise disposed on the inner wall 521 of said cylinder, the sensor array 530 effectively forms a second cylinder of substantially equal diameter. In another embodiment, the length of the sensor array 530 is approximately equal to the outer circumference of the cylinder, such that when the sensor array 530 is adhered to, or otherwise disposed on the outer wall 522 of said cylinder, the sensor array 530 effectively forms a second cylinder of substantially equal diameter. Alternatively, other lengths of sensor arrays may be used.

In one embodiment, each sensor element of the sensor array 530 is separately connected to the processing device 210 to allow the presence of more than one touch to be correctly decoded on the sensor array 530. In one embodiment of a linear sensor array 530, each sensor element is optimally connected to a tab or other connection point approximately in the center of the sensor array 530 while lying flat. This provides the shortest path between all the sensor elements and the processing device 530 that measures their capacitance. Such connections may alternately be made at other locations than the center along the sensor array 530.

FIG. 5C illustrates one embodiment of the cylindrical protrusion 520 of FIG. 5B having a button 540 disposed on a top surface 524 of the cylindrical protrusion 520. In addition to having the sensor array 530 disposed on the inner wall 521 of the cylindrical protrusion 520, the button 540 is disposed on the top surface 524 of the cylindrical protrusion 520 to add additional functionality to the user interface. In one embodiment, the button 540 is a capacitance-sensing button, including one or more sensor elements, placed on or behind the top surface 524, that are used in conjunction with the processing device 210 to detect a presence of a conductive object on, or in close proximity to the top surface 524. The processing device 210 determines a touch of the button 540 when the presence of the conductive object is detected. In another embodiment, the button 540 is a mechanical button.

In one embodiment, the button 540 is a start or enable button in the planar top portion of the control knob 501 (e.g., top surface 524 of the cylindrical protrusion 520). For example, the processing device 210 could detect rotation of the conductive object(s) around the cylindrical protrusion 520 to control the state or load of the device to the desired state or mode, but would only engage that state or mode when a touch of the button 540 is detected following the selection of the state or mode. Alternatively, the button 540 may be used in other configurations and for other types of functions.

In another embodiment, multiple buttons 540 are disposed on the top surface 524 to add additional functionality to the control panel. In another embodiment, a display is disposed behind the top surface 524 to indicate the user interaction (e.g., motion, position, speed of rotation, or the like) with the control knob 501. The display can provide visual feedback to the operator when interacting with the user interface. In one embodiment, the display is a touch screen that allows text, graphics, or the like to be displayed and selected on the display. In another embodiment, the display includes one or more external, visual indicators, such as visual indicator 525 that indicates a position of the reference indicator (e.g., thumb). Alternatively, the visual indicator 525 can indicate other indicia of user interaction with the control panel's user interface. Alternatively, the visual indicator 525 may also be positioned on or behind surface 523, for viewing outside the cylindrical protrusion 520. In one embodiment, the protrusion 520 may be optically clear or at least partially transparent to allow viewing of the display or other visual indicators mounted behind the surfaces of the protrusion 520, such as behind the outer wall 522, or the top surface 524. In other embodiments, the outer wall 522 is opaque and the top surface 524 is optically clear or at least partially transparent to allow viewing of a display or other visual indicator mounted behind the top surface 524. Also, the display or the visual indicator 525 may change based on the mode of operation of the control knob 501 (e.g., mode selection mode, temperature-setting mode, timer-setting mode, or the like). Alternatively, the control panel 510 may include other types of external indicators in addition to, or in place of, the display or visual indicator, such as audible indicators that can audibly indicate user interaction with the control panel 510, or haptic indicators that can provide a tactile response to indicate user interaction with the control panel 510. The display or indicators, whether visual, audible, or tactile, may show motion or current relative position of the control knob 501. Alternatively, the display or indicators can be used to provide additional functionality to the control knob 501 or the control panel 510.

In one embodiment, the top surface 524 is a separate piece from the protrusion 520, and the top perimeter of the outer wall 522 is sealed against the top surface 524. The sealed protrusion 520 prevents contamination of the circuitry located on the other side of the top surface 524, such as a display circuitry, the sensor array 530, the sensor for button 540, and/or other circuitry. The sealed protrusion 520 also protects the circuitry from ESD events, since there are no openings in the sealed protrusion 520. In one embodiment, the cylindrical protrusion 520 and the top surface 524 are one integrated piece. The integrated piece includes an opening on the backside of the cylindrical protrusion 520 that allows access to the inner wall 521 of the cylindrical protrusion 520.

As described above, various types of sensor arrays and various configurations of senor elements may be used for the capacitance-sensing control knob, such as linear sensor arrays, radial sensor arrays, or a collection of sensor elements separately disposed on the inner wall of the protrusion.

Figure 5D:
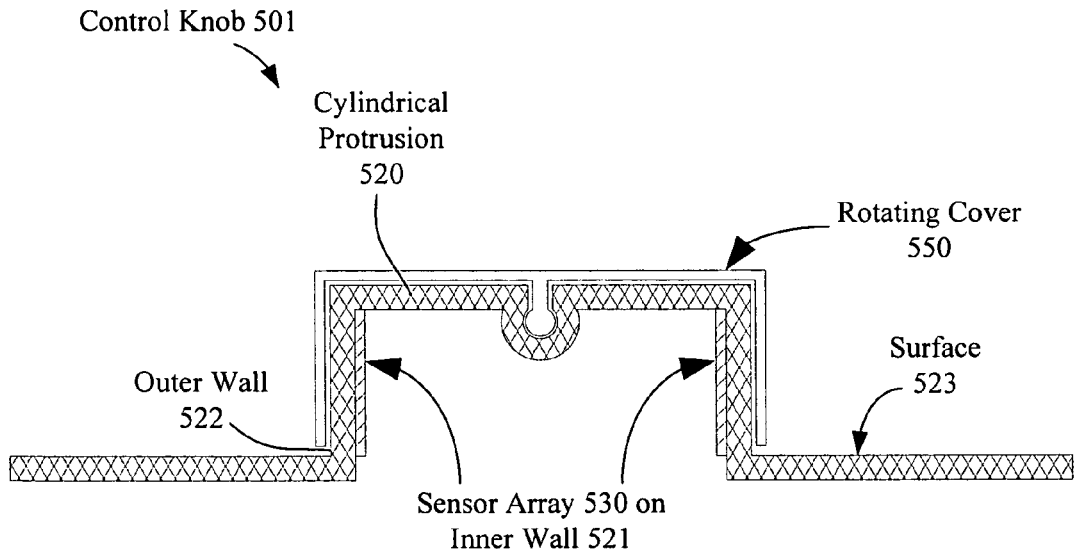
FIG. 5D illustrates a side view of one embodiment of a sensor array disposed on an inner wall of the cylindrical protrusion of FIG. 5B.

FIG. 5D illustrates a side view of one embodiment of a sensor array 530 disposed on an inner wall 521 of the cylindrical protrusion 520 of FIG. 5B. Unlike the embodiments described above, the control knob 501 of FIG. 5D includes a passive moveable part, namely a rotating cover 550 disposed on the surface of the cylindrical protrusion. The rotating cover 550 allows the gripped surface to physically move, while the sensor elements and associated visual indicators remain in fixed, non-moveable locations. The rotating cover 550 can be used to create a perception of rotational movement by the operator on the control knob 501. In this embodiment, the sensor array 530 is disposed on the inner wall of the cylindrical protrusion 520. In other embodiments, the sensor array 530 may be disposed on the outer wall 522, as illustrated in FIG. 5E.

Figure 5E:
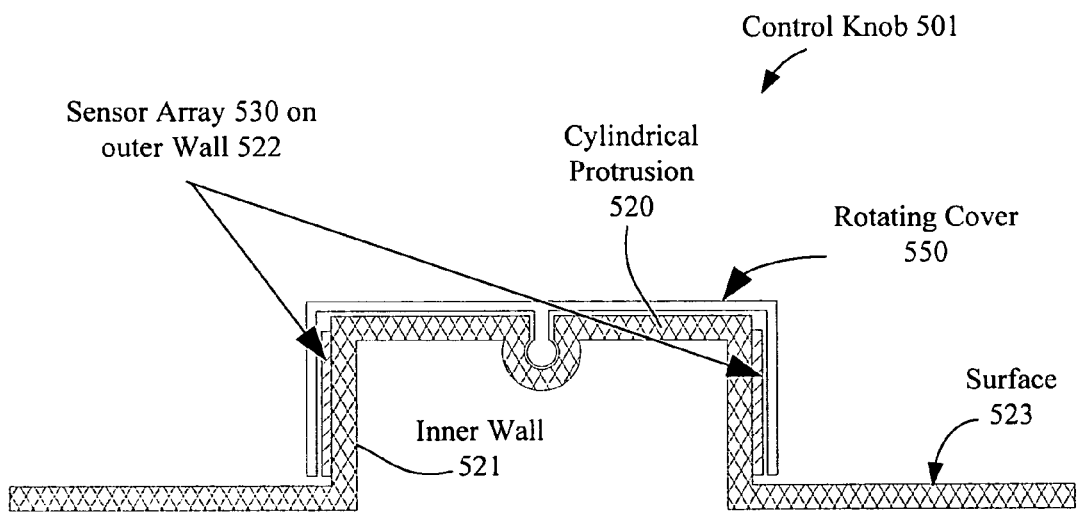
FIG. 5E illustrates a side view of one embodiment of a sensor array disposed on an outer wall of a cylindrical protrusion of FIG. 5B.

As depicted in FIG. 5E, the sensor array 530 is disposed on the outer wall of the cylindrical protrusion 520. The rotating cover 550 is disposed over the sensor array 530. In one embodiment, the rotating cover 550 is configured to protect the sensor elements of the sensor array 530 from contact with the operator, from contaminants, or the like. In another embodiment, an additional protective layer, such as an overlay can be disposed over the sensor elements of the sensor array 530 to protect the sensor elements.

In one embodiment, the rotating cover 550 is coupled to the cylindrical protrusion 520 by way of a ball-and-socket type joint. The ball-shaped surface of rotating cover 550 fits into the cuplike depression of the top surface of the cylindrical protrusion 520. This configuration allows the rotating cover 550 to be coupled to the cylindrical protrusion, but allows the rotating cover 550 to rotate about the ball-and-socket type joint. It should be noted that although the embodiments of FIGS. 5D and 5E depict the rotating cover 550 being coupled to the cylindrical protrusion 520 by way of a ball and socket joint, other types of connections can be used to couple the rotating cover 550 to the cylindrical protrusion 520 that allows the rotating cover 550 to rotate.

FIG. 6A illustrates one embodiment of a linear sensor array 600 to be disposed on the inner wall 521, or outer wall 522, of the cylindrical protrusion 520 of FIG. 5B. The linear sensor array 600 includes multiple sensor elements 601 that are disposed linearly to form the linear sensor array 600. The linear sensor array 600 includes a sufficient number and shape of sensor elements to allow reasonably accurate detection of the location of at least one isolated conductive object (e.g., finger) placed along the outside wall 522 of the cylindrical protrusion 520. The sensor elements 601 of the linear sensor array 600 are rectangular sensor elements that are evenly disposed on the linear sensor array 600. The linear sensor array 600 may be disposed on the inner wall 521 so that the ends 601 and 602 are connected or otherwise disposed adjacent to one another, forming a cylinder sensor array on the inner wall 521 of the cylindrical protrusion 520. In one embodiment, the length of the linear sensor array 600 is substantially equal to the interior circumference of the cylindrical protrusion 520. Alternatively, the length of the linear sensor array 600 is less than the interior circumference of the cylindrical protrusion 520. In another embodiment, the linear sensor array 600 may be disposed on the outer wall 522 so that the ends 601 and 602 are connected or otherwise disposed adjacent to one another, forming a cylinder sensor array on the outer wall 522 of the cylindrical protrusion 520. In one embodiment, the length of the linear sensor array 600 is substantially equal to the exterior circumference of the cylindrical protrusion 520.

Although the sensor elements 601 of the linear sensor array 600 are rectangular, in other embodiments, the sensor elements may be other shapes and sizes.

FIG. 6B illustrates another embodiment of a linear sensor array 650 to be disposed on the inner wall 521 or outer wall 522 of the cylindrical protrusion 520 of FIG. 5B. The linear sensor array 650 includes multiple sensor elements 661 that are disposed linearly to form the linear sensor array 600. However, unlike the sensor elements 601 of the linear sensor array 600, the sensor elements 651 have saw-tooth-shaped edges. Also, since the sensor elements 651 are saw-tooth shaped, the linear sensor array 650 may include less sensor elements than the linear sensor array 600. Despite having less sensor elements 651, the linear sensor array 650 includes a sufficient number of sensor elements 651 to allow reasonably accurate detection of the location of at least one isolated conductive object (e.g., finger) placed along the outside wall 522 of the cylindrical protrusion 520. The linear sensor array 650 may be disposed on the inner wall 521 so that the sensor elements located at ends 651 and 652 are connected or otherwise disposed adjacent to one another, forming a cylinder sensor array on the inner wall 521 of the cylindrical protrusion 520. In one embodiment, the length of the linear sensor array 650 is substantially equal to the interior circumference of the cylindrical protrusion 520. Alternatively, the length of the linear sensor array 650 is less than the interior circumference of the cylindrical protrusion 520. In an alternate embodiment, the linear sensor array 650 may be disposed on the outer wall 522 so that the sense elements located at ends 651 and 652 are connected or otherwise disposed adjacent to one another, forming a cylinder sensor array on the outer wall 522 of the cylindrical protrusion 520. In one embodiment, the length of the linear sensor array 650 is substantially equal to the exterior circumference of the cylindrical protrusion 520.

Although the sensor elements 601 and 651 are used in linear sensor arrays, in other embodiments, the sensor elements 601 and 651 may be disposed in other types of sensor arrays, such as radial sensor arrays used in radial sliders, and may have other types of shapes than rectangles and saw-tooth shapes. For example, if the control knob is a conical shape or a tapered shape, instead of cylindrical, tapered sensor elements of a radial slider or of a curved slider may be used.

Figure 7A:
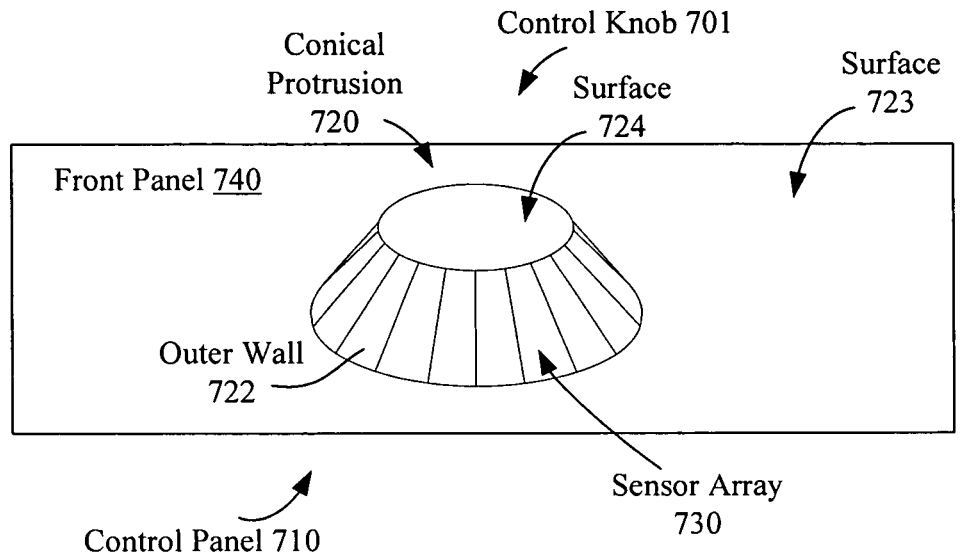
FIG. 7A one embodiment of a control panel having a sensor array disposed on a wall of a conical protrusion.

FIG. 7A illustrates one embodiment of a control panel 710 having a sensor array 730 disposed on a wall of a conical protrusion 720. The conical protrusion 720 protrudes from the surface 723 of the front panel 740 of the control panel 710. The conical protrusion 720 resembles a mechanical control knob, however, may not include any moving parts. In one embodiment, the conical protrusion 720 does not include any moving parts. In another embodiment, a passive moveable cover is present that allows the gripped surface to physically move, while the sensor elements and associated indicators remain in fixed, non-moveable locations. In one embodiment, the conical protrusion 720 includes a flat top surface 724, forming a round control knob whose outer perimeter tapers towards the flat surface 724 from the surface 723 of the front panel 740. However, in other embodiments, the conical protrusion 720 can be other tapered shapes.

The control knob 701 includes a sensor array 730 that is disposed on the inner wall of the conical protrusion 720. However, unlike the sensor array 530, the sensor array 730 of the control knob 701 is a radial senor array (illustrated in FIG. 7B), instead of a linear sensor array. In one embodiment, the sensor array 730 is a radial sensor array whose ends are connected together, forming a conical sensor array that fits within the conical protrusion 720. Alternatively, the sensor array 730 may be a sensor array having multiple sensor elements disposed in other patterns on the inner wall of the conical protrusion 720. Alternatively, the sensor array 730 may be a sensor array having multiple sensor elements disposed on the outer wall 722 of the conical protrusion 720.

In one embodiment, the conical protrusion 720 and the front panel 740 are two separate pieces, and the bottom perimeter of the outer wall 722 is sealed against the front panel 740. The sealed conical protrusion 720 prevents contamination of the circuitry located on the other side of the control panel 710. The sealed conical protrusion 720 also protects the control circuitry from ESD events, since there are no openings in the front panel 740. In another embodiment, the conical protrusion 720 and the front panel 740 are one integrated piece. The integrated piece includes an opening on the backside of the conical protrusion 720 that allows access to the inner wall of the conical protrusion 720.

As described above, one or more displays or display elements (e.g., visual indicators) may be mounted behind or around the conical protrusion 720 as described above with respect to the cylindrical protrusion 520.

Figure 7B:
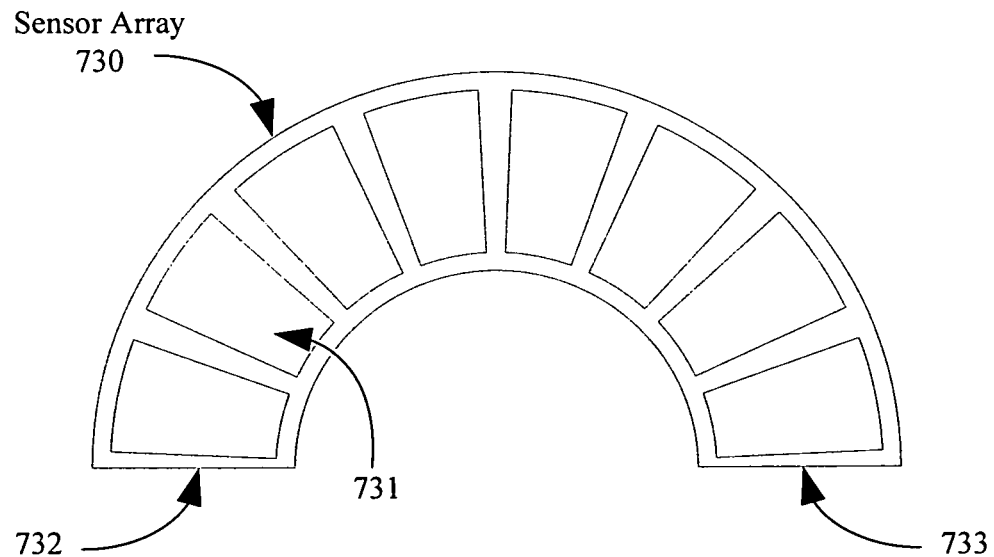
FIG. 7B illustrates one embodiment of a radial sensor array to be disposed on a wall of the conical protrusion of FIG. 7A.

FIG. 7B illustrates one embodiment of a radial sensor array disposed on the inner wall of the conical protrusion of FIG. 7A. The radial sensor array 730 includes multiple sensor elements 731 that are disposed non-linearly to form the radial sensor array 730. The radial sensor array 730 includes a sufficient number and shape to allow reasonably accurate detection of the location of at least one isolated conductive object (e.g., finger) placed along the outside wall 722 of the conical protrusion 720. The sensor elements 731 of the radial sensor array 730 are trapezoidal-shaped sensor elements that are evenly disposed on the radial sensor array 730. The radial sensor array 730 may be disposed on the inner wall so that the ends 732 and 733 are connected or otherwise disposed adjacent to one another, forming a conical sensor array on the inner wall of the conical protrusion 720. In one embodiment, the lengths of the inner and outer diameters of the radial sensor array 730 are substantially equal to the bottom circumference of the conical protrusion 720 at the surface 723 and the top circumference of the conical protrusion 720 at the top surface 724. Alternatively, the lengths of the radial sensor array 730 are less than the circumferences of the conical protrusion 720. In an alternate embodiment, the radial sensor array 730 may be disposed on the outer wall so that the ends 732 and 733 are connected or otherwise disposed adjacent to one another, forming a conical sensor array on the outer wall 722 of the conical protrusion 720.

The half-circle sensor array 730, when disposed on the proper conical shape, fully lines the interior or exterior wall of that shape. Although the sensor elements 731 of the radial sensor array 730 are trapezoids, in other embodiments, the sensor elements 731 may be other shapes and sizes. For example, alternate angles of taper will have different lengths and radii of the inner and outer arcs. In another embodiment, instead of disposing a radial sensor array of a radial slider, individual sensor elements of various shapes can be individually disposed on the inner wall of the conical protrusion 720. It should be noted that although the sensor elements 731 of the radial sensor array 730 forms a half circle, in other embodiments, other non-linear sensor arrays may be used for other protrusion shapes.

Each of the sensor elements 731 of the sensor array 730 is coupled to processing device 210, as described above with respect to the sensor array 530. The processing device 210 is configured to detect a presence of a single conductive object, or detect the presence of multiple conductive objects on the sensor array 730, and isolate a reference indicator (e.g., thumb), as described above. The processing device 210 may also be configured to determine position, direction, and speed of the single conductive object or the reference indicator (when multiple conductive objects are detected), as described above.

Although the embodiments of FIGS. 5A-5E and FIGS. 7A and 7B illustrate and describe control knobs that are cylindrical and conical, in other embodiments, the control knobs may be other shapes with at least one protruding surface upon which at least one sensor element can be disposed on a surface that is not in the plane of surface of the control panel.

As described above, like conventional control knobs that are operated by rotating the user's complete hand, instead of just a single finger, the control knobs 501 and 701, including the processing device 210 and the sensor array (530 or 730), detect rotation of a complete hand about the outer wall of the protrusion. For example, the user can grip the outer wall of the protrusion and turn their hand to emulate the rotation of a control knob as the processing device 210 electronically monitors the position, direction of movement, and speed of movement of the user's hand. Using the embodiments described herein, as a hand grasps the side of the protrusion, the thumb comes down in isolation from the remainder of the fingers. This allows the thumb to be detected and used for motion tracking. In one embodiment, the processing device 210 implements an algorithm to isolate the thumb, or space between the thumb and last touching finger, as a reference indicator from other multiple substantially simultaneous touches on the sensor array. The embodiments described herein include a capacitive sensing interface that uses a combination of hardware and firmware elements to determine the position of one or more fingers on a sensor array and make decisions in a user interface based on the position and/or movement of the one or more fingers along the array. In particular, once the processing device 210 has isolated the thumb or gap as the reference indicator, the processing device 210 can use the position of the reference indicator to determine the direction of movement, speed of movement, or the like of the reference indicator.

FIG. 8A illustrates detected fingers 812 and thumb 811 of a left hand 810 on a sensor array disposed on a wall of a protrusion 830 of a control panel according to one embodiment of the present invention. The user's left hand 810 grips the protrusion 830 with the four fingers 812 and the thumb 811. The processing device 210 detects the fingers 812 and the thumb 811 on the sensor array that is disposed on a wall of the protrusion 830. The processing device 210 determines the positions of the fingers 812 and the thumb 811 to identify one of them as the reference indicator based on the determined positions. The processing device 210 may determine the positions of the fingers 812 and the thumb 811 by determining a capacitance maximum that corresponds to each of the positions of fingers 812 and thumb 811 detected on the sensor array. In one embodiment, in order to identify the reference indicator (e.g., thumb), the processing device 210 determines the distances 814-818 between each adjacent position of the fingers 812 and thumb 811 based on the positions determined by the multiple capacitance maxima. The processing device 210 identifies the reference indicator (e.g., thumb) by determining a reference position using the greatest distance between the adjacent positions of the fingers 812 and thumb 811. For example, in the depicted embodiment of FIG. 8A, the processing device 210 is able to determine the two largest gaps between touches. Typically, when rotating a control knob, a user grips the control knob with more than one finger, and in the case of multiple fingers, the thumb is the farthest away from the other fingers. As such, when multiple fingers are present, typically the fingers 812 are detected in a cluster and the thumb 811 is isolated in distance from the cluster of fingers 812. In particular, the radial distances 814 and 818 between the touch of the thumb 811 and the two adjacent touches, the left-most touch of one of the fingers 812 and the right-most touch of another finger 812, are larger than the distances between the fingers 812 (e.g., 817, 816, 815). Since the touch for the thumb 811 has the two largest distances between the two adjacent touches, the position where the thumb 811 is detected becomes the reference position 813, and the processing device 210 can determine that this touch is the thumb 811. In an alternate embodiment, the reference position may be set equivalent to the middle of the largest radial distance between touches 818. This reference location is not located at any sensed capacitance maximum, but is instead placed at the center of the largest radial gap between sensed maxima. Like the isolated reference position of a thumb, the center of this largest gap 818 may also be processed by the processing device 210 to determine the direction of movement, speed of movement, or the like of the reference indicator.

Due to the tight and uncontrolled spacing of most fingers on a hand when gripping a control knob, the position and movement of these fingers may not be reliably detected and used for tracking position and direction of the fingers on the sensor array 530. However, the thumb 811 is isolated from the other fingers 812 when gripping the control knob. This is true for all primates with opposable thumbs. In another embodiment, even if all four fingers are not used to grip the control knob, the processing device 210 can isolate the thumb 811 when there are at least two fingers 812 and the thumb 811 detected on the outer wall of the protrusion 830. In another embodiment, even if only one finger and thumb is used to grip the control knob, the processing device 210 can select one of the detected finger 812 or detected thumb 811 and designate the selection as the reference indicator. However, it should be noted that since most mechanical control knobs are rotated with three or more fingers (including the thumb), a user will typically use three or more fingers to grip the protrusion 830, and as such, the thumb 811 can be isolated by determining the touch that has the two largest gaps between the adjacent touches. Once the reference indicator (e.g., thumb) is isolated a normal centroid calculation can be used to determine the center point of the reference indicator on the sensor array. In another embodiment, a single finger can be used to control the control knob. In this embodiment, the processing device 210 detects a single touch and uses the touch as the reference indicator and can determine the position, direction, speed of the reference indicator, or the like.

In one embodiment, once the reference indicator has been identified or once the single finger has been detected, the processing device 210 can determine a direction of movement of the reference indicator (or single finger) on the sensor array and/or the change in position of the reference indicator (or single finger) on the sensor array.

In one embodiment, the sensor array does not use diplexing to reduce the number of connections to the processing device 210, and each of the sensor elements of the sensor array are separately connected to the processing device 210 to allow the presence of one or more touches to be correctly decoded. Allowing the sensor array to detect the presence of more than one touch on the sensor array allows the processing device 210 to identify the reference indicator when multiple touches are detected on the sensor array.

FIG. 8B illustrates detected fingers 822 and thumb 821 of a right hand 820 on a sensor array of the protrusion 830 of FIG. 8A. Similarly, the processing device 210 detects the fingers 822 and the thumb 821 and is able to identify the thumb 821 as the reference indicator at the reference position 823, as described above.

In a control-knob emulation, the actual position or location of the finger touches may be irrelevant, since what is important is proper detection of the direction and amount of rotation of the knob. By isolating the reference position of the thumb, the direction and radial change in position of the thumb or other reference location can be determined and used to control the device, much like turning a mechanical control knob. However, as described herein, additional functionally can be added to the control knob that uses the sensor array, such as by adding an additional button on the top surface, configuring the control knob to perform different functions based on a mode of operation, and even by adding a touch screen to the top surface of the protrusion, since there may be no moving parts on the protrusion.

Depending on the desired usage model for the control knob, the controlling software may also support a second mode of operate wherein a scan of the sensing elements indicates that only a single touch is present. In this case, the single touch can be any finger and both direction and radial movement can be measured directly from this single touch.

In one embodiment, as the user lightly grips this knob and rotates their hand (in either direction), the position of the thumb is tracked and used to determine the selected function or setting. Since this is under software/firmware control, the control knob can be allowed to rotate a full 360 degrees, or have limits or stops. These stops can be indicated, for example, by a display or optical indicators mounted behind the sensor array, if the sensors are transparent or otherwise configured to allow light through. Likewise these optical indicators may be located as an alphanumeric display, linear graphic/segment display, or radial graphic/segment display around the outside of the control knob. This optical indicator may also be located so as to display through the top surface of the control knob, as described above. The visual indicators may be display elements, such as light-emitting diodes (LEDs), Electroluminescent (EL) lamps, LCD displays, electrophoretic, vacuum fluorescent, or other common display/illumination technology. In one embodiment, a Multi-segment EL lamp is placed behind the sensor array along the interior wall of the control knob itself. In another embodiment, position indication may be implemented in conjunction with proximity sensing to prolong the life of the displays or display elements.

In another embodiment, stepping from one setting to another may also be indicated by specific sounds, such as clicks, beeps, or fixed tones, tactile vibrations, or combinations thereof. For example, full linear response may be represented by a linear change in audible frequency, as generated by a speaker located within the product.

In the event of loss and eventual return of power, the processing device 210 may return the state of the controls to a failsafe setting, instead of to the last programmed setting. This is important for appliances such as ovens when an ON condition following return of power may be quite hazardous. In another embodiment, a memory, such as a non-volatile random access memory (NVRAM) may be used to support a 'resume' function. The 'resume' function may restore the display indicators to the last entered position.

Figure 9:
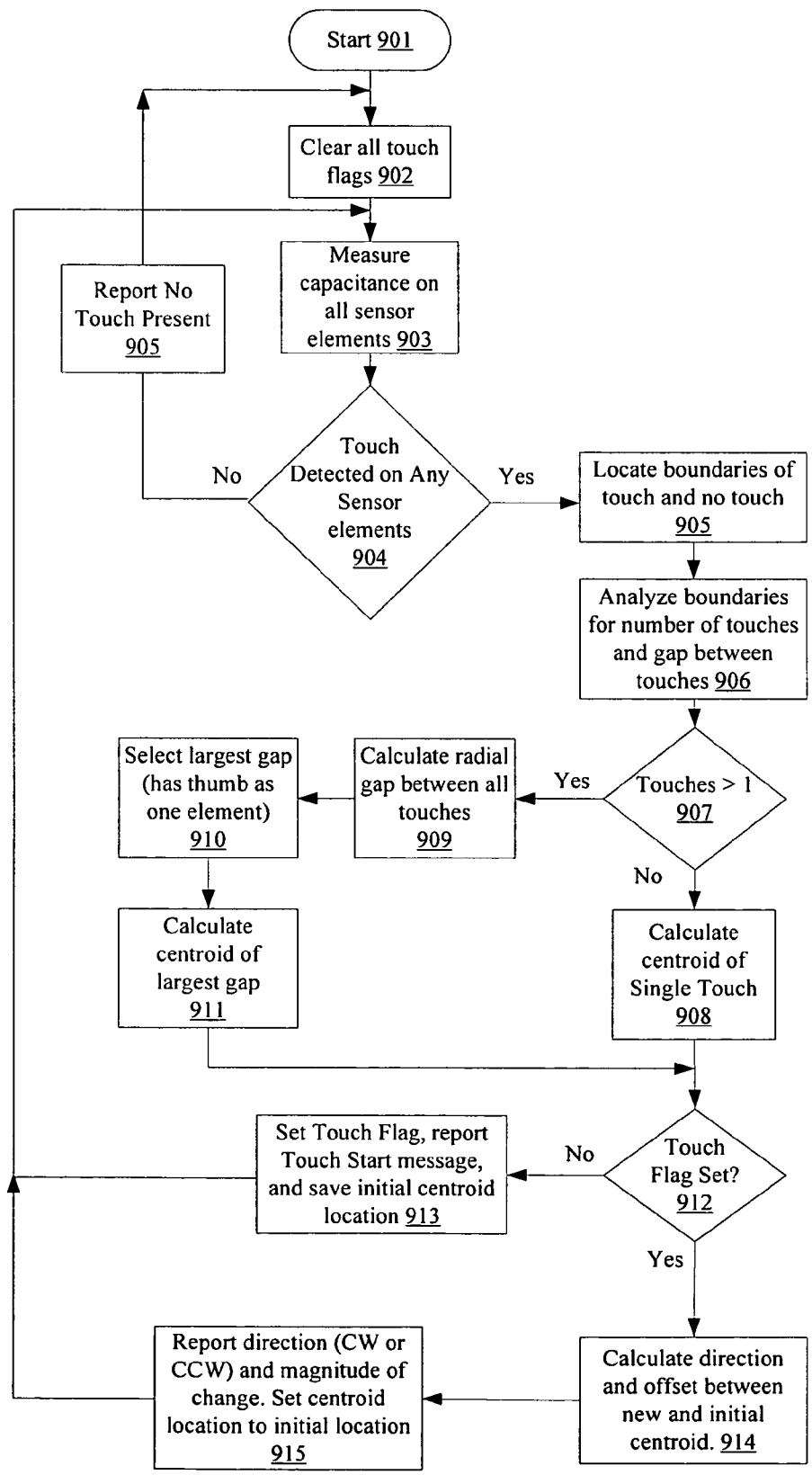
FIG. 9 illustrates a flow chart of one embodiment of a method for detecting interaction of a user with a sensor array disposed on a wall of a protrusion of a control panel that physically resembles a mechanical knob protruding from the surface of the control panel of a device.

FIG. 9 illustrates a flow chart of one embodiment of a method 900 for detecting interaction of a user with a sensor array disposed on a wall of a protrusion of a control panel that physically resembles a mechanical knob protruding from the surface of the control panel of a device. The method 900 starts in operation 901, and clears all touch flags, operation 902. The touch flags are used to track the touches detected on the sensor array. The capacitance is measured on all of the sensor elements, operation 903. The method then determines whether there were any touches detected on the sensor elements, operation 904. If no touches are detected in operation 904, then a "no touches present" condition is reported, operation 905. However, if there are touches detected in operation, the method locates the boundaries of the touch and no-touch areas, operation 905. It should be noted that all sensors are tracked for a baseline level, and also have a threshold above the baseline to determine if a touch is present. When the sensed capacitance on any sensor is above the "touch present" level, it and the sensors adjacent to it are measured for their relative magnitudes to determine a proper centroid of touch. Any sensor below the touch-present threshold is a no-touch area, while those above it indicate detection of a touch. In areas where the fingers are close together, all of the sensors in that area may indicate touch being present. Relative to FIG. 8A, the areas between the fingers 812 and 811 could all be no-touch areas, depending on the granularity of the sensors in the ring, and the threshold level set. However, if the granularity of these sensors is large (i.e., few sensors), all four fingers 812 may be sensed as one large touch. Sensing all four fingers 812 as one large touch does not present a problem, since the thumb can be located by identifying the two large no-touch areas (indicated by radial distances 814 and 818). In another embodiment of locating a position reference, the largest no-touch area (indicated by the radial distance 818) can be located, and the center of that area can be calculated, or some other point of reference within the area (e.g., always the left-most or right most edge of the gap) may be selected.

The method then analyzes the boundaries for any number of touches and gaps between touches, operation 906. The method determines whether the number of touches is greater than one, operation 907. If the number of touches is not greater than one, then the method calculates the centroid of the single touch, operation 908. However, if the number of touches is greater than one, then the method calculates the radial gaps (e.g., distances) between all touches, operation 909. The method then selects the touch that has the largest gaps between the other touches to isolate the thumb as the conductive object to track, operation 910. The method then calculates the centroid of the largest gap, operation 911. After the centroid is calculated in either operation 908 or 911, the method determines if the touch flag is set, operation 912. If the touch flag is not set, the method sets the touch flag, reports a "touch start" message, saves the initial centroid location, operation 913, and returns to operation 903 that measures the capacitance on each of the sensor elements. However, if the touch flag is set, the method calculates the direction (e.g., clockwise (CW) or counter-clockwise (CCW)) and offset between the new centroid and the initial centroid, operation 914. The method then reports the direction and radial change, sets the new centroid location as the initial location, operation 915, and returns to operation 903 that measures the capacitance on each of the sensor elements.

It should be noted that the embodiments described with respect to FIG. 9 tracks the center of the largest gap as the reference indicator. These embodiments may take fewer computations to find the center of the largest gap as the reference indicator. In another embodiment, the largest gap could be located, then the immediate left, and immediate right of the largest gap can be evaluated to find the second largest gap. The thumb can then be located between the largest and second largest gaps, and the thumb can be identified as the reference locator.

Embodiments of the present invention may have one or more of the following advantageous. A principal such advantage is the lack of moving parts, which allows capacitance sensing to provide great improvements in reliability, since there are no moving parts to wear out. Another advantage is that the top surface may be used for additional functionality, since the top surface is not a moving part like the top surface of mechanical control knob that is restricted due to the required motion. Another advantage is that the processing device 210 can be programmed to return the device to a safe state following loss of power, preventing the control knob from being in a dangerous condition when the power is restored. The device, implementing the embodiments described herein, may be implemented in a sealed assembly, preventing possible contamination from water, dirt, corrosives, or the like, and preventing paths for ESD events into the circuitry behind the control panel. Another advantage may be that the embodiments described herein provide a user interface that is familiar to users, while providing an electronic control knob, rather than a mechanical control knob. Also, since the control knob is electric, the control knob can be configured to operation in more than one mode of operation, such as selecting a mode, adjusting a temperature, adjusting a timer, or the like. Another advantage may be that, since there are no moving parts on the control knob, displays or display elements (e.g., visual indicators) can be implemented behind the surfaces of the protrusion. The displays or display elements may be used to display the internal state or position indicators of the control knob on the surfaces of the protrusion, such as the walls or top surface of the protrusion. Although in other embodiments, a passive rotating cover can be coupled to the protrusion, allowing the operator to physically turn the rotating cover. Another advantage of the embodiments described herein is that they may provide a user interface that allows a physically challenged user to control the user interface without requiring physical strength to actually turn a control knob.

Embodiments of the present invention, described herein, include various operations. These operations may be performed by hardware components, software, firmware, or a combination thereof. As used herein, the term "coupled to" may mean coupled directly or indirectly through one or more intervening components. Any of the signals provided over various buses described herein may be time multiplexed with other signals and provided over one or more common buses. Additionally, the interconnection between circuit components or blocks may be shown as buses or as single signal lines. Each of the buses may alternatively be one or more single signal lines and each of the single signal lines may alternatively be buses.

Certain embodiments may be implemented as a computer program product that may include instructions stored on a computer-readable medium. These instructions may be used to program a general-purpose or special-purpose processor to perform the described operations. A computer-readable medium includes any mechanism for storing or transmitting information in a form (e.g., software, processing application) readable by a computer. The computer-readable medium may include, but is not limited to, magnetic storage medium (e.g., floppy diskette); optical storage medium (e.g., CD-ROM); magneto-optical storage medium; read-only memory (ROM); random-access memory (RAM); erasable programmable memory (e.g., EPROM and EEPROM); flash memory; electrical, optical, acoustical, or other form of propagated signal (e.g., carrier waves, infrared signals, digital signals, etc.); or another type of medium suitable for storing electronic instructions.

Additionally, some embodiments may be practiced in distributed computing environments where the computer-readable medium is stored on and/or executed by more than one computer system. In addition, the information transferred between computer systems may either be pulled or pushed across the communication medium connecting the computer systems.

Although the operations of the method(s) herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. A method comprising:
receiving a plurality of signals from a sensor array disposed on a side wall of a non-movable, non-mechanical protrusion, wherein the protrusion is integrated into a surface of a control panel of a device as one integrated piece and physically resembles a mechanical knob that protrudes from the surface of the control panel of the device, wherein the protrusion extends out from the surface of the control panel such that a user's hand can at least grab an outer surface of the protrusion or move over the outer surface to operate the device and includes an opening on a back side of the protrusion that allows access to the side wall of the protrusion; and
detecting interaction of the user's hand with the sensor array based on the plurality of signals when the user's hand grabs the protrusion or moves over the outer surface;
wherein detecting the interaction comprises:
detecting presences of multiple conductive objects on the sensor array;
determining positions of the multiple conductive objects; and
identifying one of the multiple conductive objects as a finger and isolating the finger as a reference indicator based on the positions of the multiple conductive objects,
wherein identifying one of the multiple conductive objects as the reference indicator comprises:
determining a distance between each directly adjacent position of the multiple conductive objects based on a capacitance maximum for each of the multiple conductive objects, wherein each capacitance maximum corresponds to the positions of the multiple conductive objects; and
identifying a reference position using two greatest distances between the directly adjacent positions of the multiple conductive objects, wherein the one of the multiple conductive objects that is located at the reference position is identified as the finger.

2. An apparatus comprising:
a control panel having a non-movable, non-mechanical protrusion integrated with a surface of the control panel, as one integrated piece, that physically resembles a mechanical knob protruding from the surface of the control panel, wherein the protrusion is cylindrical or conical, wherein the protrusion extends out from the surface of the control panel such that a user's hand can interact with at least a portion of an outer surface of the protrusion to operate the control panel and includes an opening on a back side of the protrusion that allows access to a side wall of the protrusion;
a sensor array disposed on a side wall of the protrusion to detect the interaction of the user's hand with the sensor array when the user's hand grabs the protrusion or moves over the outer surface; and
a processing device coupled to the sensor array to detect the interaction of the user's hand with the sensor array by:
detecting presences of multiple conductive objects on the sensor array;
determining positions of the multiple conductive objects; and
identifying one of the multiple conductive objects as a finger and isolating the finger as a reference indicator based on the positions of the multiple conductive objects,
wherein identifying one of the multiple conductive objects as the reference indicator comprises:
determining a distance between each directly adjacent position of the multiple conductive objects based on a capacitance maximum for each of the multiple conductive objects, wherein each capacitance maximum corresponds to the positions of the multiple conductive objects; and
identifying a reference position using two greatest distances between the directly adjacent positions of the multiple conductive objects, wherein the one of the multiple conductive objects that is located at the reference position is identified as the finger.

3. The apparatus of claim 1, further comprising a display disposed on a top surface of the protrusion to indicate the interaction of the user with the control panel.

4. The apparatus of claim 1, further comprising an external indicator to indicate the interaction of the user with the control panel.

5. The apparatus of claim 1, wherein the apparatus is an electrical appliance, and wherein the processing device, protrusion, and sensor array operate as a control knob of the electrical appliance.

6. The apparatus of claim 2, further comprising a moveable part disposed on the protrusion and configured to engage the protrusion such that the moveable part moves with reference to the protrusion, while the sensor array and protrusion remain in fixed, non-moveable locations.

7. An apparatus, comprising:
a processing device to receive a plurality of signals from a sensor array, wherein the sensor array is disposed on a side wall of a non-movable, non-mechanical protrusion integrated with a surface of a control panel of a device as one integrated piece, wherein the protrusion extends out from the surface of the control panel such that a user's hand can interact with at least a portion of an outer surface of the protrusion to operate the device and includes an opening on a back side of the protrusion that allows access to the side wall of the protrusion;
wherein the processing device is configured to detect the interaction of the user's hand with the sensor array based on signals received from the sensor array by:
detecting presences of multiple conductive objects on the sensor array;
determining positions of the multiple conductive objects; and
identifying one of the multiple conductive objects as a finger and isolating the finger as a reference indicator based on the positions of the multiple conductive objects,
wherein identifying one of the multiple conductive objects as the reference indicator comprises:
determining a distance between each directly adjacent position of the multiple conductive objects based on a capacitance maximum for each of the multiple conductive objects, wherein each capacitance maximum corresponds to the positions of the multiple conductive objects; and identifying a reference position using two greatest distances between the directly adjacent positions of the multiple conductive objects, wherein the one of the multiple conductive objects that is located at the reference position is identified as the finger.

8. The apparatus of claim 7, wherein the processing device comprises:

a capacitance sensor to measure a capacitance on the sensor array; and a selection circuit coupled to a plurality of sensor elements of the sensor array and the capacitance sensor, wherein the selection circuit is configured to select each of the plurality of sensor elements to measure the capacitance on each of the plurality of sensor elements.

9. The apparatus of claim 8, wherein the capacitance sensor is a relaxation oscillator, and wherein the relaxation oscillator is coupled to a digital counter.

10. The apparatus of claim 8, wherein the capacitance sensor includes a sigma-delta modulator circuit, and wherein the sigma-delta modulator circuit is coupled to a digital filter to measure a ratio of pulse widths of an output of the sigma-delta modulator circuit.

* * * * *